United States Patent
Tsuji et al.

(10) Patent No.: US 6,818,570 B2
(45) Date of Patent: Nov. 16, 2004

(54) METHOD OF FORMING SILICON-CONTAINING INSULATION FILM HAVING LOW DIELECTRIC CONSTANT AND HIGH MECHANICAL STRENGTH

(75) Inventors: Naoto Tsuji, Tama (JP); Yukihiro Mori, Tama (JP); Satoshi Takahashi, Tama (JP); Kiyohiro Matsushita, Tama (JP); Atsuki Fukazawa, Tama (JP); Michael Todd, Phoenix, AZ (US)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 10/351,669

(22) Filed: Jan. 24, 2003

(65) Prior Publication Data

US 2003/0176030 A1 Sep. 18, 2003

(30) Foreign Application Priority Data

Mar. 4, 2002  (JP) ...................................... 2000-056829

(51) Int. Cl.$^7$ .............................................. H01L 21/00
(52) U.S. Cl. ....................................... 438/910; 438/680
(58) Field of Search ................................ 438/910, 758, 438/778, 789, 790, 971, 680

(56) References Cited

U.S. PATENT DOCUMENTS

| | | | |
|---|---|---|---|
| 5,279,865 A | * 1/1994 | Chebi et al. .............. | 427/571 |
| 5,364,666 A | 11/1994 | Williams et al. ............ | 427/579 |
| 5,508,368 A | 4/1996 | Knapp et al. ............... | 427/534 |
| 5,593,741 A | * 1/1997 | Ikeda ......................... | 427/579 |
| 5,788,778 A | * 8/1998 | Shang et al. ................. | 134/1 |
| 6,432,846 B1 | * 8/2002 | Matsuki ...................... | 438/790 |

FOREIGN PATENT DOCUMENTS

| | | |
|---|---|---|
| EP | 0 299 754 A2 | 1/1989 |
| EP | 0 826 791 A2 | 3/1998 |
| EP | 1 225 194 A2 | 7/2002 |
| WO | WO 99/29477 | 6/1999 |
| WO | WO 01/94448 A2 | 12/2001 |

* cited by examiner

Primary Examiner—David Nhu
(74) Attorney, Agent, or Firm—Knobbe Martens Olson & Bear, LLP

(57) ABSTRACT

A silicon-containing insulation film having high mechanical strength is formed on a semiconductor substrate by (a) introducing a reaction gas comprising (i) a source gas comprising a silicon-containing hydrocarbon compound containing cross-linkable groups, (ii) a cross-linking gas, and (iii) an inert gas, into a reaction chamber where a substrate is placed; (b) applying radio-frequency power to create a plasma reaction space inside the reaction chamber; and (c) controlling a flow of the reaction gas and an intensity of the radio-frequency power.

49 Claims, 16 Drawing Sheets

METHOD OF FORMING SILICON-CONTAINING INSULATION FILM HAVING LOW DIELECTRIC CONSTANT AND HIGH MECHANICAL STRENGTH

BACKGROUND OF THE INVENTION

1. Field of the Invention

This invention relates generally to a semiconductor technique and more particularly to a method for forming on a semiconductor substrate a silicon-containing insulation film having high mechanical strength by using a plasma CVD (chemical vapor deposition) apparatus.

2. Description of the Related Art

As semiconductors have progressed to accommodate a demand for high speed and high density in recent years, a reduction of capacitance between lines is required to avoid signal delays in the multi-layer wiring technology field. Because a reduction in the dielectric constant of a multi-layer wiring insulation film is required in order to reduce the capacitance between lines, insulation films having low dielectric constants have been developed.

Conventionally, a silicon oxide ($SiO_x$) film is formed by adding oxygen ($O_2$), nitric oxide (NO) or nitrous oxide ($N_2O$) as an oxidizing agent to a silicon source gas such as $SiH_4$ and $Si(OC_2H_5)_4$ and applying heat or plasma energy to the source gas. A dielectric constant ($\epsilon$) of this film was approximately 4.0.

By contrast, by using a spin-coat method using inorganic silicon oxide glass (SOG) materials, a low dielectric constant insulation film having a dielectric constant ($\epsilon$) of approximately 2.3 was formed.

By using a plasma CVD method with CxFyHz as a source gas, a low dielectric constant fluorinated amorphous carbon film having a dielectric constant ($\epsilon$) of approximately 2.0 to 2.4 was formed. Further, by using a plasma CVD method using a silicon-containing hydrocarbon (for example, P-TMOS (phenyltrimethoxysilane) as a source gas, a low dielectric constant insulation film having a dielectric constant ($\epsilon$) of approximately 3.1 was formed. Additionally, by using a plasma CVD method using a silicon-containing hydrocarbon having multiple alkoxy groups as a source gas, a low dielectric constant insulation film having a dielectric constant ($\epsilon$) of approximately 2.5 was formed when optimizing film formation conditions.

However, the above-mentioned conventional approaches have the following problems:

In the case of the inorganic SOG insulation film formed by the spin-coat method, there are problems in that the materials properties are not distributed equally on a silicon substrate and that a device used for a curing process after coating the material is expensive.

In the case of the fluorinated amorphous carbon film formed by the plasma CVD method using CxFyHz as a source gas, there are problems such as low heat resistance (370° C. or lower), poor adhesion with silicon materials, and low mechanical strength of the film formed.

Furthermore, among silicon-containing hydrocarbons, when P-TMOS is used, a polymerized oligomer cannot form a linear structure such as a siloxane polymer because P-TMOS contains three alkoxy groups. Consequently, a porous structure is not formed on a silicon substrate, and hence a dielectric constant cannot be reduced to a desired degree.

When a silicon-containing hydrocarbon containing two alkoxy groups is used, a polymerized oligomer can form a linear structure such as a siloxane polymer by optimizing film formation conditions. Consequently, a porous structure can be formed on a silicon substrate and a dielectric constant can be reduced to a desired degree. However, there are problems in that oligomers having the linear structure have weak bonding power therebetween and thus the mechanical strength of a resultant film is low.

SUMMARY OF THE INVENTION

In view of the above problems, an object of the present invention is to provide a method of forming an insulation film having a low dielectric constant and high mechanical strength. Another object of the present invention is to provide a method of forming an insulation film having a low dielectric constant without increasing device costs.

To solve the above-mentioned problems, in an embodiment of the present invention, the method of forming an insulation film having a low-dielectric constant according to the present invention comprises the following processes: A process of bringing a reaction gas comprising a silicon-containing hydrocarbon having cross-linkable groups such as multiple alkoxy groups and/or vinyl groups, a cross-linking gas, and an inert gas into a reaction chamber, a process of applying radio-frequency power by overlaying first radio-frequency power and second radio-frequency power or applying the first radio-frequency power alone for generating a plasma reaction field inside the reaction chamber, and a process of optimizing the flow rates of respective source gases and the intensity of each radio-frequency power.

As the source gas, a silicon-containing hydrocarbon having multiple cross-linkable groups is used singly or in combination with one or more other silicon-containing hydrocarbons such as those having one or more cross-linkable groups. The cross-linkable groups include, but are not limited to, alkoxy groups and/or vinyl groups. For example, if a silicon-containing hydrocarbon having no or one alkoxy group is exclusively used, a linear siloxane oligomer can be formed when supplementing oxygen using an oxygen-supplying gas as necessary. However, in that case, it is difficult to cross-link oligomers by using a cross-linking gas in order to increase mechanical strength of a resultant film. A silicon-containing hydrocarbon having no or one alkoxy group can be used in an amount less than a silicon-containing hydrocarbon having two or more alkoxy groups. In an embodiment, 10% or more (including 15%, 20%, 25%, 30%, 40%, 50%, 60%, 70%, 80%, 90%, and 100%) of the gas may be a silicon-containing hydrocarbon having two alkoxy groups in order to predominantly or significantly form linear oligomers. Preferably, as the source gas, the silicon-containing hydrocarbon having multiple alkoxy groups is a linear compound such as dimethyldimethoxysilane (DM-DMOS) or 1,3-dimethoxy-tetramethyldisiloxane (DMOTMDS). A silicon-containing hydrocarbon having a cyclic main structure may be used in an amount less than a linear silicon-containing hydrocarbon. In the above, alkoxy groups include $-OC_nH_{2n+1}$ (n is an integer of 1–4). The source gas can be a compound containing vinyl groups such as 1,3-divinyltetramethyldisiloxane, and similarly to a compound having alkoxyl groups, the compound can form oligomers.

As a cross-linking gas ("cross-linker"), any suitable reactive gas such as $CO_2$, ethylene glycol, 1,2-propanediol, isopropyl alcohol (IPA), ethylene, $N_2$ or diethyl ether can be used which can cross-link oligomers of silicon-containing hydrocarbon. For example, any suitable alcohol, ether, and/ or unsaturated hydrocarbon can be used, which include an alcohol selected from the group consisting of $C_{1-6}$ alkanol and $C_{4-12}$ cycloalkanol, and the unsaturated hydrocarbon selected from the group consisting of $C_{1-6}$ unsaturated hydrocarbon, $C_{4-12}$ aromatic hydrocarbon unsaturated compounds, and $C_{4-12}$ alicyclic hydrocarbon unsaturated compounds. In the foregoing, compounds having a higher number of carbon atoms include, but are not limited to: 1,4-cyclohexane diol (b.p. 150° C./20 mm), 1,2,4-trivinylcyclohexane (b.p. 85–88° C./20 mm), 1,4-cyclohexane dimethanol (b.p. 283° C.), and 1,3-cyclopentane diol (80–85° C./0.1 Torr). Further, compounds having multiple reactive groups ('mixed' functionalities, i.e., unsaturated hydrocarbon and alcohol functionalities) can also be used as cross-linkers, which include, but are not limited to: $C_{3-20}$ ether such as ethylene glycol vinyl ether $H_2C=CHOCH_2OH$ (b.p. 143° C.), ethylene glycol divinyl ether $H_2C=CHOCH_2CH_2OCH=CH_2$ (b.p. 125–127° C.), and 1,4-cyclohexane dimethanol divinyl ether (b.p. 126° C./14 mm) $(H_2C=C(OH)-CH_2)_2-(CH_2)_6)$; and $C_{5-12}$ cycloalkanol compounds such as 1-vinylcyclohexanol (b.p. 74° C./19 mm). Usable reactive gases are not limited to the above and will be explained below. As an inert gas, Ar, Ne, and/or He may be used. Further, as an oxygen-supplying gas, $O_2$, NO, $O_3$, $H_2O$ or $N_2O$ can be included to supply oxygen in the source gas if sufficient oxygen atoms are not present in the silicon-containing hydrocarbon.

In an embodiment, by overlaying high-frequency RF power and low-frequency RF power, the cross-linking of oligomers can effectively be performed. For example, a combination of high-frequency RF power having 2 MHz or higher frequencies and low-frequency RF power having less than 2 MHz frequencies can be used. The low-frequency RF power is effective even at a low power level such as 0.5 W/cm$^2$ or lower (including 0.2, 0.1, 0.075, 0.05, 0.025 W/cm$^2$, and a range including any two of the foregoing). In contrast, the high-frequency RF power is applied at a high power level such as 1.5 W/cm$^2$ or higher (including 2.0, 2.25, 2.5, 2.75, 3.0, 3.25, 3.5 W/cm$^2$, and a range including any two of the foregoing). Such a high power level can increase the mechanical strength and deposition rate of a resultant insulation film.

According to an embodiment of the present invention, a silicon-containing insulation film having a low dielectric constant and high mechanical strength can effectively be formed by using a cross-linking gas and optimizing the flow rate of each gas and the power intensity of the radio-frequency power source(s). In the embodiment, a low-dielectric constant is achieved by formation of oligomers (e.g., siloxane polymers) composed of residues of silicon-containing hydrocarbons each having two or more alkoxy groups, and high mechanical strength is achieved by cross-linking the oligomers while maintaining a low-dielectric constant. Additionally, according to an embodiment of the present invention, an insulation film having a low-dielectric constant can easily be formed without increasing device costs.

The present invention is also drawn to a method for increasing mechanical strength of an insulation film formed on a semiconductor substrate, residing in the features described above. In an embodiment, an insulation film has a dielectric constant of 2.8 or less (including 2.7, 2.6, 2.5, 2.4, 2.3, 2.2, 2.1, 2.0, and a range including any two of the foregoing) and a hardness (mechanical strength) of 1.0 GPa or higher (including 1.25, 1.5, 1.75, 2.0, 2.25, 2.5, 2.75, 3.0, and a range including any two of the foregoing), depending on the type of source gas, the type of cross-linking gas, and the intensity of RF power, for example.

According to an embodiment of the present invention, a silicon-containing insulation film can be formed on a substrate, which film is a plasma polymerization product obtainable by the above-mentioned method. The plasma polymerization product has a structure where silicon-containing hydrocarbon compounds each containing plural alkoxy groups are cross-linked using a cross-linking agent selected from the group consisting of $C_{1-6}$ alkanol, $C_{1-6}$ ether, $C_{1-6}$ unsaturated hydrocarbon, $CO_2$, and $N_2$. The plasma polymerization product may have a hardness of 2.5 GPa or higher and a dielectric constant of 2.8 or lower, or a hardness of 1.0 GPa or higher and a elastic modulus of 5.0 GPa or higher as well as a dielectric constant of 2.5 or lower, for example, depending on the type of source gas and cross-linking gas and the plasma polymerization conditions. In the present invention, polymerization includes oligomerization, and oligomers include structures of $(M)_n$ (M is a constituent unit, n is an integer of 2–50, including ranges of 5–30 and 10–20).

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENT

Figure 1:
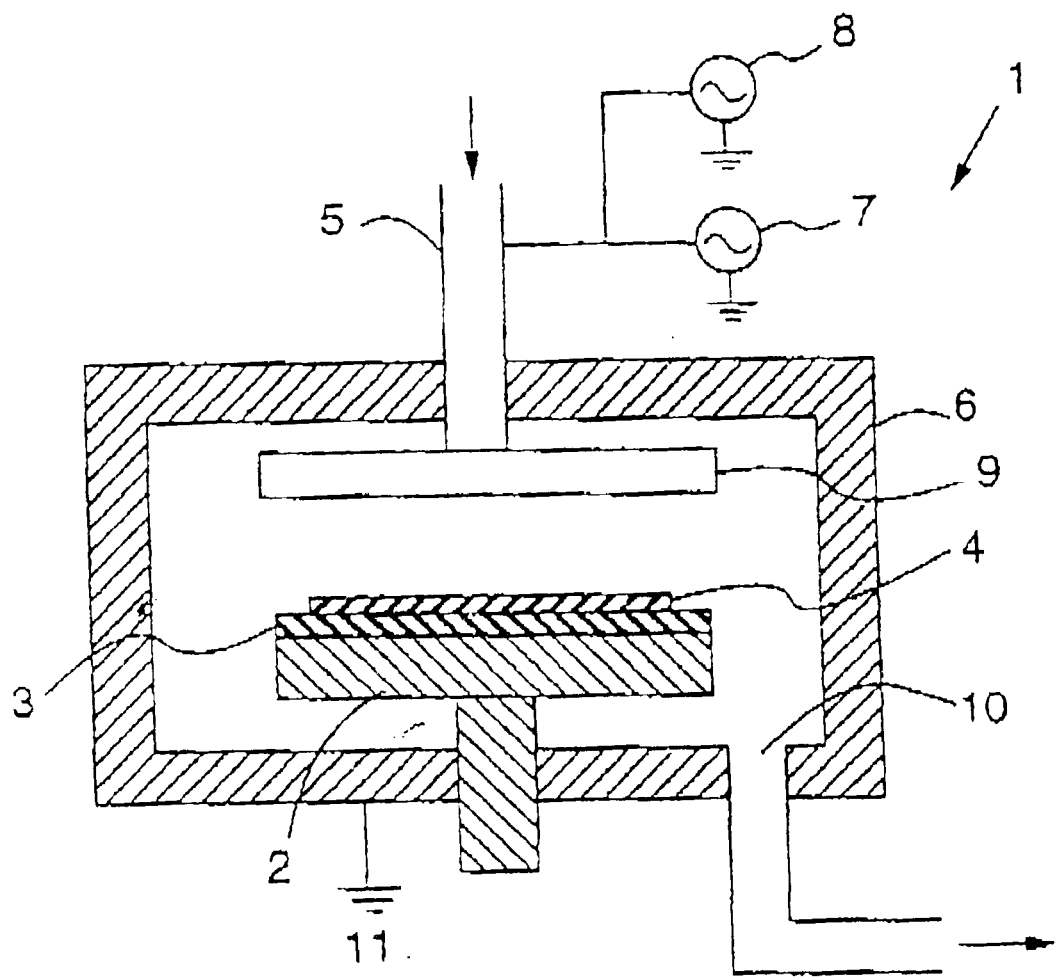
FIG. 1 is a schematic diagram illustrating a plasma CVD apparatus used for forming an insulation film of this invention.

In an embodiment of the present invention, a method is provided to form a silicon-containing insulation film on a substrate by plasma reaction, comprising the steps of: (a) introducing a reaction gas comprising (i) a source gas comprising a silicon-containing hydrocarbon compound containing multiple cross-linkable groups, (ii) a cross-linking gas, and (iii) an inert gas, into a reaction chamber where a substrate is placed; (b) applying radio-frequency power to create a plasma reaction space inside the reaction chamber; and (c) controlling a flow of the reaction gas and an intensity of the radio-frequency power. In an embodiment, the method forms a silicon-containing insulation film on a substrate by plasma reaction, comprising the steps of: (A) introducing a reaction gas comprising (I) a source gas comprising at least one silicon-containing hydrocarbon compound containing plural alkoxy groups, (II) a cross-linking gas selected from the group consisting of $C_{1-6}$ alkanol, $C_{1-6}$ ether, $C_{1-6}$ unsaturated hydrocarbon, $CO_2$, and $N_2$, and (III) an inert gas, into a reaction chamber where a substrate is placed; (B) applying radio-frequency power to create a plasma reaction space inside the reaction chamber; and (C) controlling a flow of the reaction gas and an intensity of the radio-frequency power.

As described above, the present invention includes various embodiments. For example, the radio-frequency power may be a combination of high-frequency power and low-frequency power. Further, the high-frequency power may have a frequency of 2 MHz or higher (including 5, 10, 15, 20, 25, 30, 40, 50, 60, and 70 MHz, and a range including any two of the foregoing), and the lower-frequency power has a frequency of less than 2 MHz (including 1 MHz, 800, 600, 400, 200, 100 KHz, and a range including any two of the foregoing). Alternatively, the radio-frequency power can be a single frequency power. The intensity of the radio-frequency power may be 1.5 W/cm² or higher, and when overlaying low-frequency RF power, the intensity of the high-frequency power may be 1.5 W/cm² or higher, and the intensity of the low-frequency power may be 0.01 W/cm² or higher. More than two RF power frequencies can be overlaid. For example, high-frequency power (e.g., 20–30 MHz), intermediate-frequency power (e.g., 1–5 MHz), and low-frequency power (e.g., 200–800 kHz)can be overlaid.

The source gas may be a compound having the formula $Si_\alpha O_{\alpha-1} R_{2\alpha-\beta+2}(OC_n H_{2n+1})_\beta$ wherein $\alpha$ is an integer of 1–3, $\beta$ is 2 or 3, n is an integer of 1–3, and R is attached to Si and selected from the group consisting of $C_{1-12}$ hydrocarbon, $C_{1-12}$ fluorohydrocarbon, $C_{1-12}$ perfluorocarbon, H, D, F, Cl, Br, and I. In an embodiment, R may be $C_{1-6}$ hydrocarbon. The source gas can also be comprised of a mixture of one or more of the compounds described by the formula above. In an embodiment, $\alpha$ is 1 or 2, and $\beta$ is 2. This type of source gas is disclosed in U.S. Pat. No. 6,352,945, U.S. Pat. No. 6,383,955, and U.S. Pat. No. 6,432,846, all of which are incorporated herein by reference in their entirety. In embodiments, the source gas may be dimethyl-dimethoxysilane (DM-DMOS), 1,3-dimethoxytetramethyldisiloxane (DMOTMDS), or phenyl-methyl dimethoxysilane (PM-DMOS). Different source gases can be mixed or a single source gas can be used alone. An additional molecule that might be a useful additive to the sources listed above is 1,3-divinyl tetramethylsilane (DVTMS, $[CH_2=CH_2Si(CH_3)_2]_2O$). Such a silicon-containing compound having unsaturated hydrocarbons can be useful to improve the mechanical strength by promoting cross-linking molecules.

The flow rate of a reaction gas and the intensity of RF power are controlled to form an insulation film having a hardness (mechanical strength) of 1.0 GPa or higher, or 2.5 GPa or higher, depending on the type of source gas, for example.

The inert gas can be any suitable inert gas including Ar, Ne and He. The reaction gas may further comprise an oxygen-supplying gas. The oxygen-supplying gas can be any suitable gas which can supply oxygen and may include $O_2$, NO, $O_3$, $H_2O$ and $N_2O$. In an embodiment, the oxygen-supplying gas may be supplied at a flow rate lower than that of the source gas. The inert gas may be supplied at a flow rate of 15–300% (50% or more in an embodiment) of that of the source gas.

In an embodiment, the cross-linking gas may be a $C_{2-4}$ alkanol such as ethylene glycol, 1,2-propanediol, and isopropyl alcohol. In another embodiment, the cross-linking gas may be a $C_{2-4}$ ether such as diethyl ether. In still another embodiment, the cross-linking gas may be a $C_{2-4}$ unsaturated hydrocarbon such as $C_2H_4$, $C_3H_4$, $C_3H_6$, $C_4H_8$, $C_3H_5(CH_3)$, and $C_3H_4(CH_3)_2$. Compounds having a skeleton of a higher number of carbon atoms such as $C_{4-12}$ aromatic hydrocarbons and $C_{4-12}$ alicyclic hydrocarbons can also be used as cross-linkers if they posses reactive groups, which compounds include, but are not limited to: $C_{4-12}$ cycloalkanol such as 1,4-cyclohexane diol (b.p. 150° C./20 mm), 1,4-cyclohexane dimethanol (b.p. 283° C.), and 1,3-cyclopentane diol (80–85° C./0.1 Torr); and $C_{4-12}$ alicyclic hydrocarbon unsaturated compounds such as 1,2,4-trivinylcyclohexane (b.p. 85–88° C./20 mm).

Further, compounds having multiple reactive groups ('mixed' functionalities, i.e., unsaturated hydrocarbon and alcohol functionalities) can also be used as cross-linkers, which include, but are not limited to: $C_{3-20}$ ether such as ethylene glycol vinyl ether $H_2C=CHOCH_2OH$ (b.p. 143° C.), ethylene glycol divinyl ether $H_2C=CHOCH_2CH_2OCH=CH_2$ (b.p. 125–127° C.), and 1,4-cyclohexane dimethanol divinyl ether (b.p. 126° C./14 mm) ($H_2C=C(OH)-(CH_2)_2-(CH_2)_6$); and $C_{5-12}$ cycloalkanol compounds such as 1-vinylcyclohexanol (b.p. 74° C./19 mm). The higher-molecular weight type sources identified above can incorporate the desired cross-linking ligands in combination with cyclic compounds. These enable the achievement of the desired enhancement in hardness (e.g., mechanical strength) without compromising the dielectric constant because they can cross-link the linear siloxane chains, but also reduce the density of the films to a higher degree than other types of sources.

The cross-linking gas can be used singly or in any combination of the foregoing. The cross-linking gas may be supplied at a flow rate effective to cross link oligomers of compounds of the source gas, thereby increasing mechanical strength of an insulation film formed on the substrate. The flow rate of the cross-linking gas may be 20–500% of that of the source gas, depending on the type of source gas, for example.

In an embodiment, the reaction gas is excited upstream of the reaction chamber. In this embodiment, the reaction gas can be excited in a remote plasma chamber installed upstream of a reactor, and the film is deposited on a substrate in the reactor. The source gas and the additive gas (the cross-linking gas and/or the inert gas) can be introduced into the remote plasma chamber. In this case, a reaction space is composed of the interior of the remote plasma chamber, the interior of the reactor, and the interior of the piping connecting the remote plasma chamber and the reactor. Because of using the interior of the remote plasma chamber, the interior of the reactor can be significantly reduced, and thus, the distance between the upper electrode and the lower electrode can be reduced. This leads to not only downsizing the reactor, but also uniformly controlling a plasma over the substrate surface. Any suitable remote plasma chamber and any suitable operation conditions can be used in the present invention. For example, usable are the apparatus and the conditions disclosed in U.S. patent applications Ser. No. 09/511,934 filed Feb. 24, 2000 and Ser. No. 09/764,523 filed Jan. 18, 2001, U.S. Pat. No. 5,788,778, and U.S. Pat. No. 5,788,799. The disclosure of each of the above is incorporated herein by reference in its entirety.

Further, the excitation of the reaction gas may comprise exciting the additive gas and contacting the excited additive gas and the source gas. The excitation of the reaction gas can be accomplished in the reactor or upstream of the reactor. As described above, both the source gas and the additive gas can be excited in a remote plasma chamber. Alternatively, the excitation of the reaction gas can be accomplished by exciting the additive gas in a remote plasma chamber and mixing it with the source gas downstream of the remote plasma chamber. Alternatively, the reaction gas can be heated in a pre-heat chamber installed upstream of a reactor, the reaction gas is excited in the reactor, and film is deposited on the substrate in the reactor. The source gas and the additive gas can be introduced into the pre-heater chamber. In this case, the reaction space is composed of the interior of the pre-heater chamber, the interior of the reactor, and the interior of the piping connecting the pre-heater chamber and the reactor. Because of using the interior of the pre-heater chamber, the interior of the reactor can be significantly reduced, and thus, the distance between the upper electrode and the lower electrode can be reduced. This leads to not only downsizing the reactor, but also uniformly controlling a plasma over the substrate surface. Any suitable remote plasma chamber and any suitable operation conditions can be used in the present invention. For example, usable are the apparatus and the conditions disclosed in the aforesaid references.

Further, the excitation of the reaction gas comprises exciting the additive gas and contacting the excited additive gas and the source gas. In this embodiment, the additive gas can be excited in a remote plasma chamber, and the source gas is heated in a pre-heater chamber where the excited additive gas and the source gas are in contact, and then the reaction gas flows into the reactor for deposition of a film.

In this case, deposition of unwanted particles on a surface of the remote plasma chamber, which causes a failure of ignition or firing, can effectively be avoided, because only the additive gas is present in the remote plasma chamber. The source gas is mixed with the excited additive gas downstream of the remote plasma chamber.

In another embodiment, alternative plasma conditions such as use of pulsed plasma for the high and/or low frequency radiation can be employed for further stabilization of film deposition. For example, cycles of 10–100 msec and a duty (radiation period/(radiation period+non-radiation period)) of 10–90% may be preferable.

In another aspect of the present invention, a method is provided to increase mechanical strength of a silicon-containing insulation film formed on a substrate, comprising the steps of: (a) mixing a cross-linking gas selected from the group consisting of $C_{1-6}$ alkanol, $C_{1-6}$ ether, $C_{1-6}$ unsaturated hydrocarbon, $CO_2$, and $N_2$, into a source gas comprising a silicon-containing hydrocarbon compound containing plural alkoxy groups, with an inert gas; (b) introducing the mixture gas as a reaction gas into a reaction chamber where a substrate is placed; (c) applying radio-frequency power to create a plasma reaction space inside the reaction chamber; and (d) controlling a flow of the reaction gas and an intensity of the radio-frequency power. The above described features can be applied to this aspect.

In order to form oligomers in the present invention, the residence time of a reaction gas may be controlled as disclosed in U.S. Pat. No. 6,352,945, U.S. Pat. No. 6,383,955, and U.S. Pat. No. 6,432,846, all of which are incorporated herein by reference in their entirety.

The flow rate of the reaction gas is determined based on the intensity of RF power, the pressure selected for reaction, and the type of source gas and cross-linking gas. The reaction pressure is normally in the range of 1–10 Torr, preferably 3–7 Torr, so as to maintain a stable plasma. This reaction pressure is relatively high in order to lengthen the residence time of the reaction gas. The total flow of the reaction gas is important for reducing the relative dielectric constant of a resulting film. In general, the longer the residence time, the lower the relative dielectric constant becomes. The source gas flow necessary for forming a film depends on the desired deposition rate and the area of a substrate on which a film is formed. For example, in order to form a film on a substrate [r(radius)=100 mm] at a deposition rate of 300 nm/min, at least 50 sccm of the source gas (preferably 100–500 sccm, including 150, 200, 250 sccm) is expected to be included in the reaction gas.

In order to adjust the reaction in the vapor phase, it is effective to add a small amount of an inert gas to the reaction chamber. Helium (He) and Argon (Ar) are inert gases and have different first ionization energies of 24.56 eV and 15.76 eV, respectively. Thus, by adding either He or Ar singly or both in combination in predetermined amounts, the reaction of the material gas in the vapor phase can be controlled. Additionally or alternatively, neon (Ne) can be used for the same purpose. Molecules of the reaction gas undergo polymerization in the vapor phase, thereby forming oligomers. The oligomers are expected to have an O:Si ratio of 1:1. However, when the oligomers form a film on the substrate, the oligomers undergo further polymerization, resulting in a higher oxygen ratio. The ratio varies depending on the relative dielectric constant or other characteristics of a film formed on the substrate. In view of the above and also reaction efficacy, oxygen is supplied to adjust a Si/O ratio in the reaction gas.

The present invention will be further described in detail by referring to the figures. FIG. 1 is a schematic illustration of a plasma CVD device 1 used for the method of forming an insulation film having a low-dielectric constant according to an embodiment of the present invention. The plasma CVD device 1 includes a reaction chamber 6. A susceptor 3 for placing a semiconductor wafer 4 thereon is disposed inside the reaction chamber 4. The susceptor 3 is supported by a heater 2. The heater 2 maintains a temperature of the semiconductor wafer 4 at a given temperature (e.g., 350 to 450° C.). The susceptor 3 is also used as one of the electrodes for generating a plasma and is grounded 11 through the reaction chamber 6. On the ceiling inside the reaction chamber 6, a showerhead 9 is disposed in parallel to and opposing to the susceptor 3. The showerhead 9 has a large number of fine holes at its bottom. Through those fine holes, a reaction gas (which includes a source gas, a cross-linking gas, an inert gas, and other additive gas if any) described below is jetted out equally toward the semiconductor wafer 4, although the source gas, the cross-linking gas, and the inert gas can be supplied into the reaction chamber separately using different lines (not shown). At the center of the showerhead 9, a reaction gas inlet port 5 is provided and the reaction gas is brought into the showerhead 9 through a gas line (not shown). The gas inlet port 5 is electrically insulated from the reaction chamber 6. The showerhead 9 is also used as the other electrode for generating a plasma and is connected to a first radio-frequency power source and a second radio-frequency power source, which are set up externally. With this configuration, a plasma reaction space is generated in the vicinity of the semiconductor wafer 4. At the bottom of the reaction chamber 6, an exhaust port 10 is provided and is connected to an external vacuum pump (not shown).

The method of forming an insulation film having a low-dielectric constant according to an embodiment of the present invention is described below. The method includes a process of bringing a reaction gas comprised of a primary source gas, a secondary source gas (a cross-linking gas and optionally an oxygen-supplying gas), and an addition gas (an inert gas) into the showerhead 9 through the reaction gas inlet port 5. A primary source gas is a silicon-containing hydrocarbon having multiple alkoxy groups, and preferably is dimethyl-dimethoxysilane (DM-DMOS) or 1,3-dimethoxytetramethyldisiloxane (DMOTMDS). A secondary source gas is $CO_2$, or alcohol such as ethylene glycol, 1,2 propanediol and isopropyl alcohol (IPA), a hydrocarbon such as ethylene containing at least one unsaturated bond, $N_2$, or ether such as diethyl ether. When controlling a Si/O ratio is required, $O_2$, $O_3$, NO, $H_2O$ or $N_2O$ can be further added as a secondary source gas. An addition gas is an inactive gas such as Ar, Ne, and/or He.

Using ramped or different gas flows and/or alternative combinations of gases independently can be useful in order to produce materials with graded and/or different compositions at these surfaces, particularly at the initial interface of the film and at the final top surface.

Additionally, the method of forming an insulation film having a low-dielectric constant according to an embodiment of the present invention includes a process of applying radio-frequency power by overlapping a first radio-frequency power and a second radio-frequency power or a process of applying the first radio-frequency power alone to the showerhead 9. A frequency of the first radio-frequency power source 7 is preferably 2 MHz or higher. A frequency of the second radio-frequency power source 8 is preferably 2 MHz or lower. By applying the radio-frequency power to the showerhead 9, a plasma reaction space is formed in the vicinity of the semiconductor wafer 4. The reaction gas brought in through the reaction gas inlet port 5 is excited into plasma and a desired insulation film is formed on the semiconductor wafer.

With the method according to an embodiment of the present invention, by introducing alcohol such as ethylene glycol, 1,2 propanediol and isopropyl alcohol (IPA), a hydrocarbon such as ethylene containing at least one unsaturated bond, $N_2$, or ether such as diethyl ether as a secondary source gas, linear oligomers are bridged and the mechanical strength of a film can be improved while a low dielectric constant is maintained. Additionally, by overlaying the first radio-frequency power and the second radio-frequency power, the mechanical strength of the film can be further improved.

Furthermore, the method of forming an insulation film having a low-dielectric constant according to an embodiment of the present invention includes a process of optimizing a flow of respective gases and the output of the first and the second radio-frequency power sources. Examples of optimizing the output was performed as described below. In these examples, a frequency of the first radio-frequency power source 7 was 27.12 MHz. A frequency of the second radio-frequency power source 8 was fixed at 400 kHz. Frequencies other than these can be used.

In the examples, by optimizing a flow of respective gases and the output of the first and the second radio-frequency power sources, an insulation film having a dielectric constant of 2.8 or lower and film hardness of 2.5 GPa or more can be formed when DM-DMOS (dimethyl-dimethoxysilane) is used as a primary material, and an insulation film having a dielectric constant of 2.5 or lower, film hardness of 1.0 GPa or higher, and elastic modulus of 5.0 GPa or higher can be formed when DMOTMDS (1,3-dimethoxytetramethyldisiloxane) is used as a primary material.

EXAMPLES

Examples of optimizing a flow of respective gases and the output of respective radio-frequency power sources in the method of forming an insulation film having a low-dielectric constant according to the present invention were performed as follows:

Example 1

Using the plasma CVD device shown in FIG. 1, an example of forming an insulation film on a Ø300 mm silicon substrate was performed.
Experimental Conditions:

| Primary gas: | DM-DMOS (dimethyl-dimethoxysilane) | 200 sccm |
|---|---|---|
| Secondary gas: | $CO_2$ | 500 sccm |
| | $O_2$ | 0 to 200 sccm |
| Addition gas: | He | 400 sccm |
| 1st radio-frequency power source: | 27.12 MHz | 2.8 W/cm2 |
| 2nd radio-frequency power source: | 400 kHz | 0.1 W/cm2 |

Figure 2:
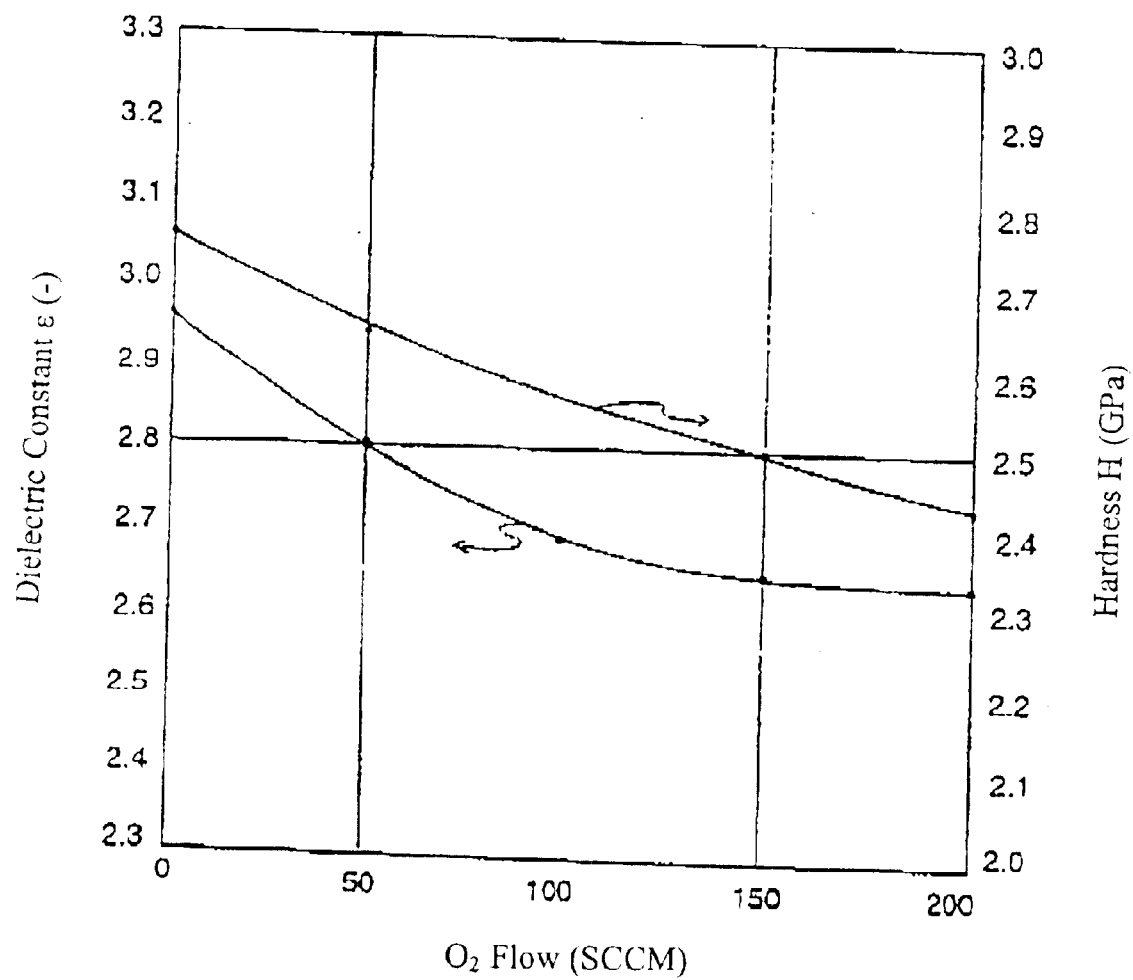
FIG. 2 is a graph showing the relationship between the dielectric constant and hardness when changing a flow rate of $O_2$ in an embodiment of the present invention.

FIG. 2 is a graph showing the relationship between the dielectric constants and film hardness when a flow of $O_2$ is altered from 0 to 200 sccm under the above-mentioned experimental conditions. The graph demonstrates that under the above-mentioned experimental conditions, an optimized flow of $O_2$ for forming an insulation film having a dielectric constant of 2.8 or lower and film hardness of 2.5 GPa or more is 50 to 150 sccm.

Example 2

Using the plasma CVD device shown in FIG. 1, an example of forming an insulation film on a Ø300 mm silicon substrate was performed.
Experimental Conditions:

| Primary gas: | DM-DMOS (dimethyl-dimethoxysilane) | 200 sccm |
|---|---|---|
| Secondary gas: | $CO_2$ | 0 to 1000 sccm |
| | $O_2$ | 100 sccm |
| Addition gas: | He | 400 sccm |
| 1st radio-frequency power source: | 27.12 MHz | 2.8 W/cm2 |
| 2nd radio-frequency power source: | 400 kHz | 0.1 W/cm2 |

Figure 3:
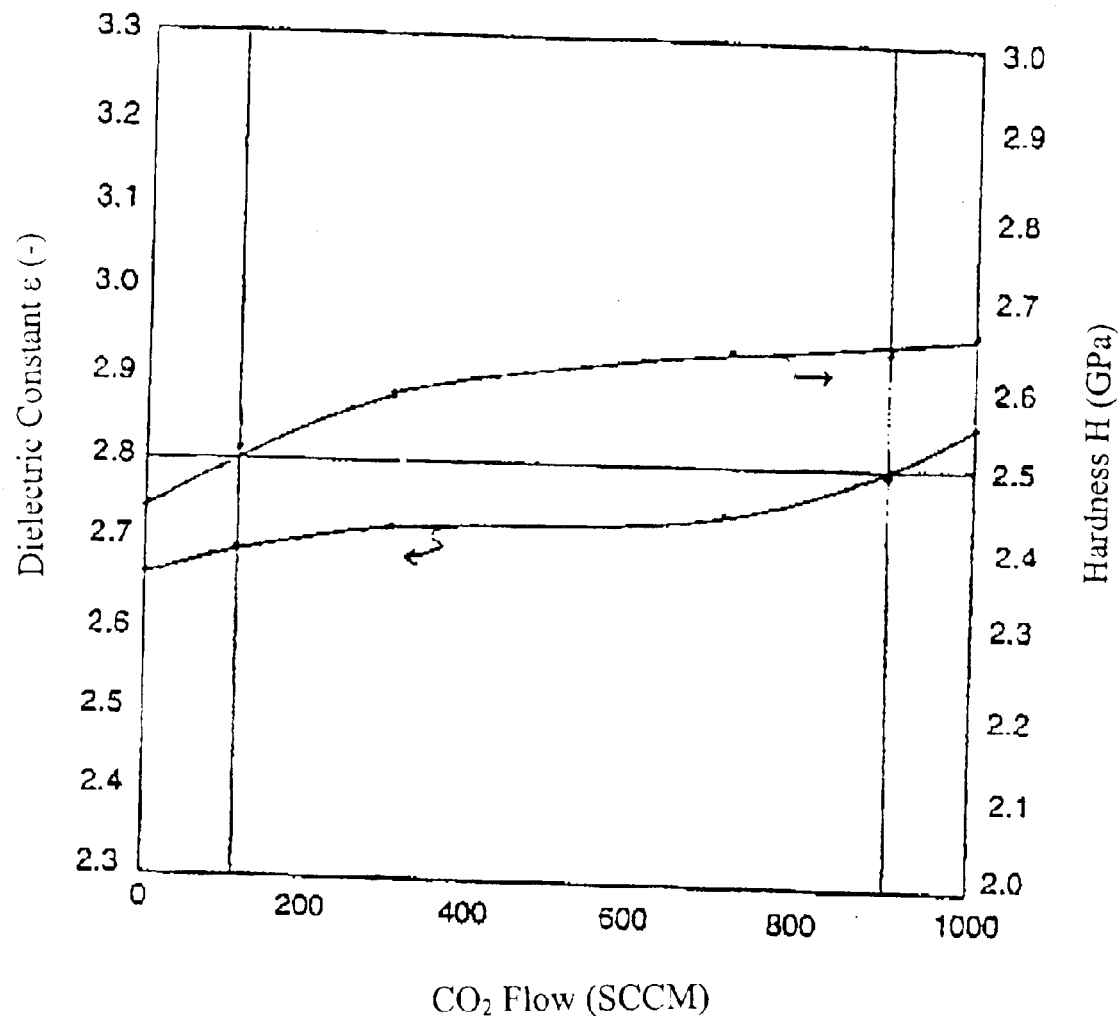
FIG. 3 is a graph showing the relationship between the dielectric constant and hardness when changing a flow rate of $CO_2$ in an embodiment of the present invention.

FIG. 3 is a graph showing the relationship between the dielectric constants and film hardness when a flow of $CO_2$ is altered from 0 to 1000 sccm under the above-mentioned experimental conditions. The graph demonstrates that under the above-mentioned experimental conditions, an optimized flow of $CO_2$ for forming an insulation film having a dielectric constant of 2.8 or lower and film hardness of 2.5 GPa or more is 100 to 900 sccm.

Example 3

Using the plasma CVD device shown in FIG. 1, an example of forming an insulation film on a Ø300 mm silicon substrate was performed.

Experimental Conditions:

| Primary gas: | DM-DMOS (dimethyl-dimethoxysilane) | 200 sccm |
|---|---|---|
| Secondary gas: | $CO_2$ | 500 sccm |
| | $O_2$ | 100 sccm |
| Addition gas: | He | 400 sccm |
| 1st radio-frequency power source: | 27.12 MHz | 2.8 W/cm2 |
| 2nd radio-frequency power source: | 400 kHz | 0 to 0.5 W/cm2 |

Figure 4:
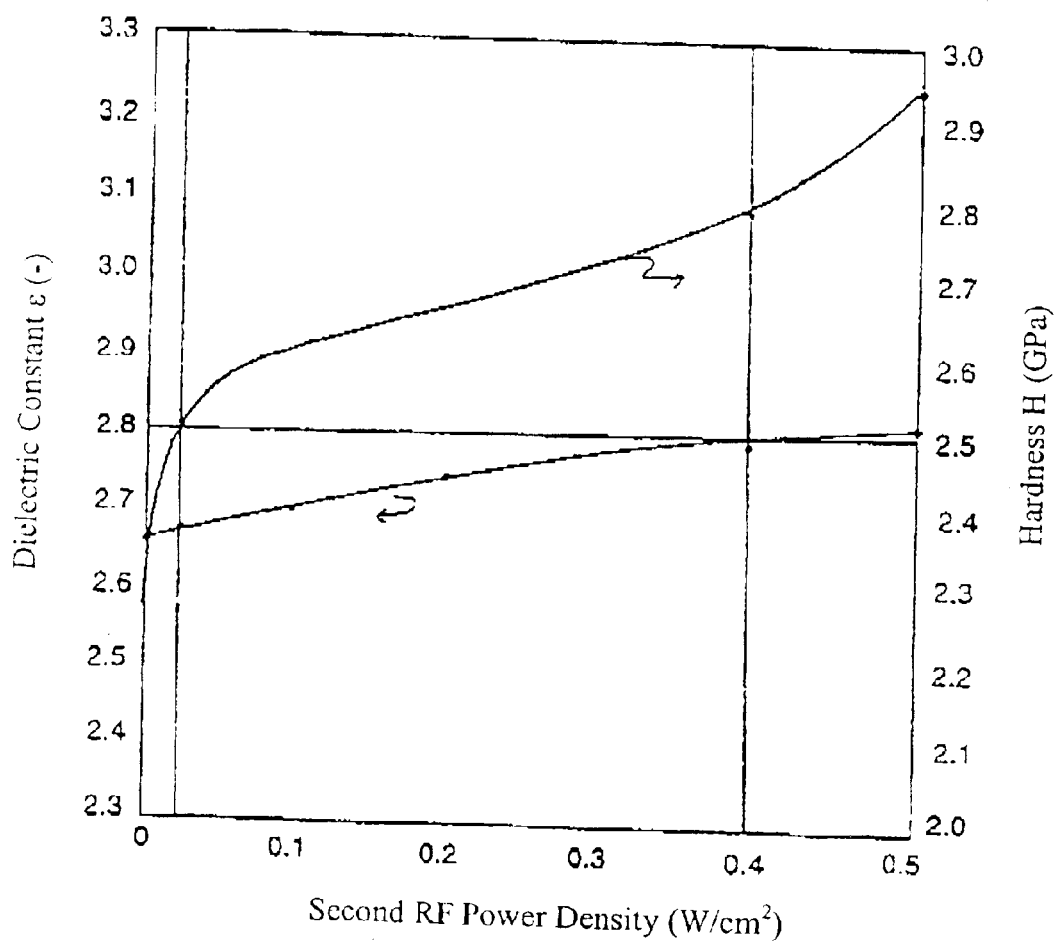
FIG. 4 is a graph showing the relationship between the dielectric constant and hardness when changing a power density of low-frequency RF power in an embodiment of the present invention.

FIG. 4 is a graph showing the relationship between the dielectric constants and film hardness when the power density of the second radio-frequency power source is altered from 0 to 0.5 W/cm2 under the above-mentioned experimental conditions. The graph demonstrates that under the above-mentioned experimental conditions, optimized power density of the second radio-frequency power source for forming an insulation film having a dielectric constant of 2.8 or lower and film hardness of 2.5 GPa or more is 0.025 to 0.4 W/cm2.

Example 4

Using the plasma CVD device shown in FIG. 1, an example of forming an insulation film on a Ø300 mm silicon substrate was performed.
Experimental Conditions:

| Primary gas: | DM-DMOS (dimethyl-dimethoxysilane) | 200 sccm |
|---|---|---|
| Secondary gas: | OH—$CH_2$—$CH_2$—OH (ethylene glycol) | 0 to 200 sccm |
| Addition gas: | He | 400 sccm |
| 1st radio-frequency power source: | 27.12 MHz | 2.5 W/cm2 |
| 2nd radio-frequency power source: | 400 kHz | 0.1 W/cm2 |

Figure 5:
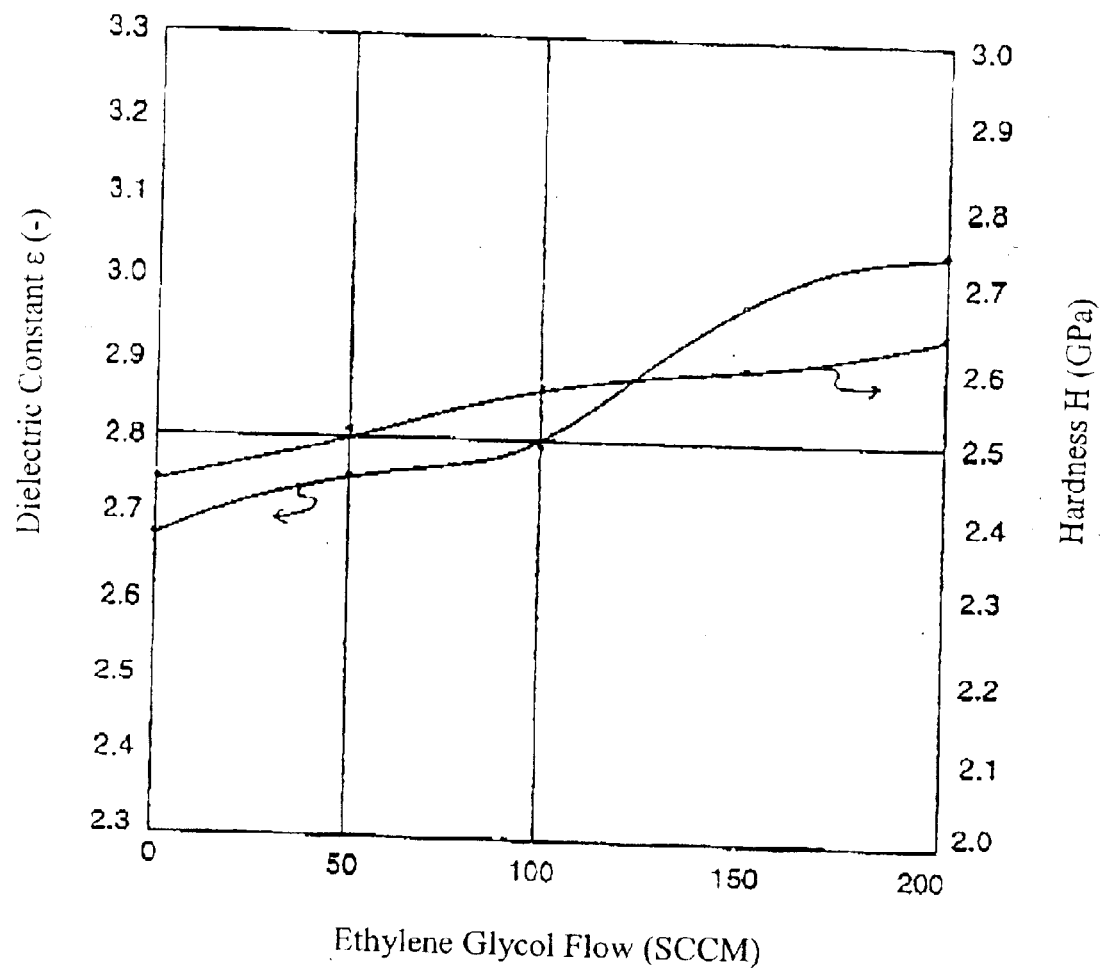
FIG. 5 is a graph showing the relationship between the dielectric constant and hardness when changing a flow rate of ethylene glycol in an embodiment of the present invention.

FIG. 5 is a graph showing the relationship between the dielectric constants and film hardness when a flow of ethylene glycol is altered from 0 to 200 sccm under the above-mentioned experimental conditions. The graph demonstrates that under the above-mentioned experimental conditions, an optimized flow of ethylene glycol for forming an insulation film having a dielectric constant of 2.8 or lower and film hardness of 2.5 GPa or more is 50 to 100 sccm.

Example 5

Using the plasma CVD device shown in FIG. 1, an example of forming an insulation film on a Ø300 mm silicon substrate was performed.
Experimental Conditions:

| Primary gas: | DM-DMOS (dimethyl-dimethoxysilane) | 200 sccm |
|---|---|---|
| Secondary gas: | OH—$CH_2$—$CH_2$—OH (ethylene glycol) | 0 to 200 sccm |
| Addition gas: | He | 400 sccm |
| 1st radio-frequency power source: | 27.12 MHz | 2.5 W/cm2 |
| 2nd radio-frequency power source: | 400 kHz | 0 W/cm2 |

Figure 6:
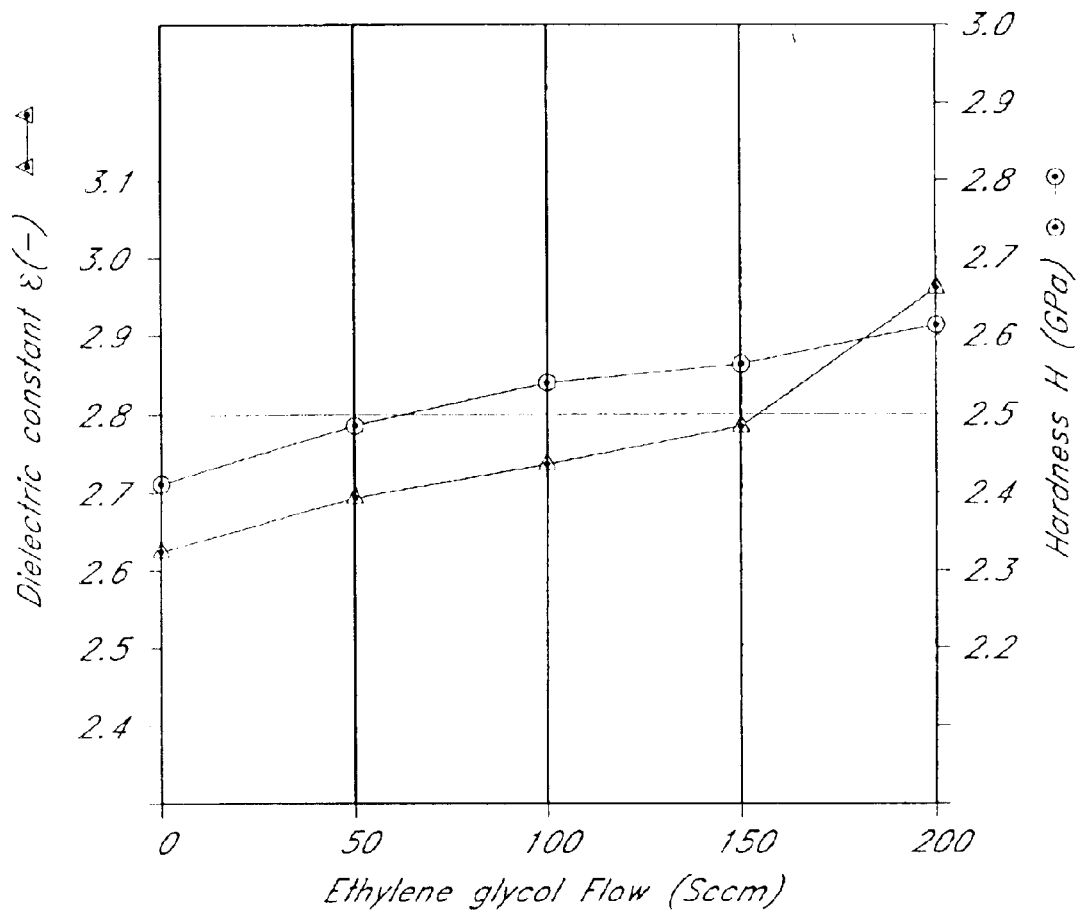
FIG. 6 is a graph showing the relationship between the dielectric constant and hardness when changing a flow rate of ethylene glycol in an embodiment without low-frequency RF power (LF power) of the present invention.

FIG. 6 is a graph showing a relation between dielectric constants and film hardness when a flow of ethylene glycol is altered from 0 to 200 sccm under the above-mentioned experimental conditions. The graph demonstrates that under the above-mentioned experimental conditions, an optimized flow of ethylene glycol for forming an insulation film having a dielectric constant of 2.8 or lower and film hardness of 2.5 GPa or more is 100 to 150 sccm.

Example 6

Using the plasma CVD device shown in FIG. 1, an example of forming an insulation film on a ⌀300 mm silicon substrate was performed.
Experimental Conditions:

| | | |
|---|---|---|
| Primary gas: | DM-DMOS (dimethyl-dimethoxysilane) | 150 sccm |
| Secondary gas: | 1,2 propanediol | 0 to 400 sccm |
| Addition gas: | He | 300 sccm |
| 1st radio-frequency power source: | 27.12 MHz | 2.2 W/cm2 |
| 2nd radio-frequency power source: | 400 kHz | 0.075 W/cm2 |

Figure 7:
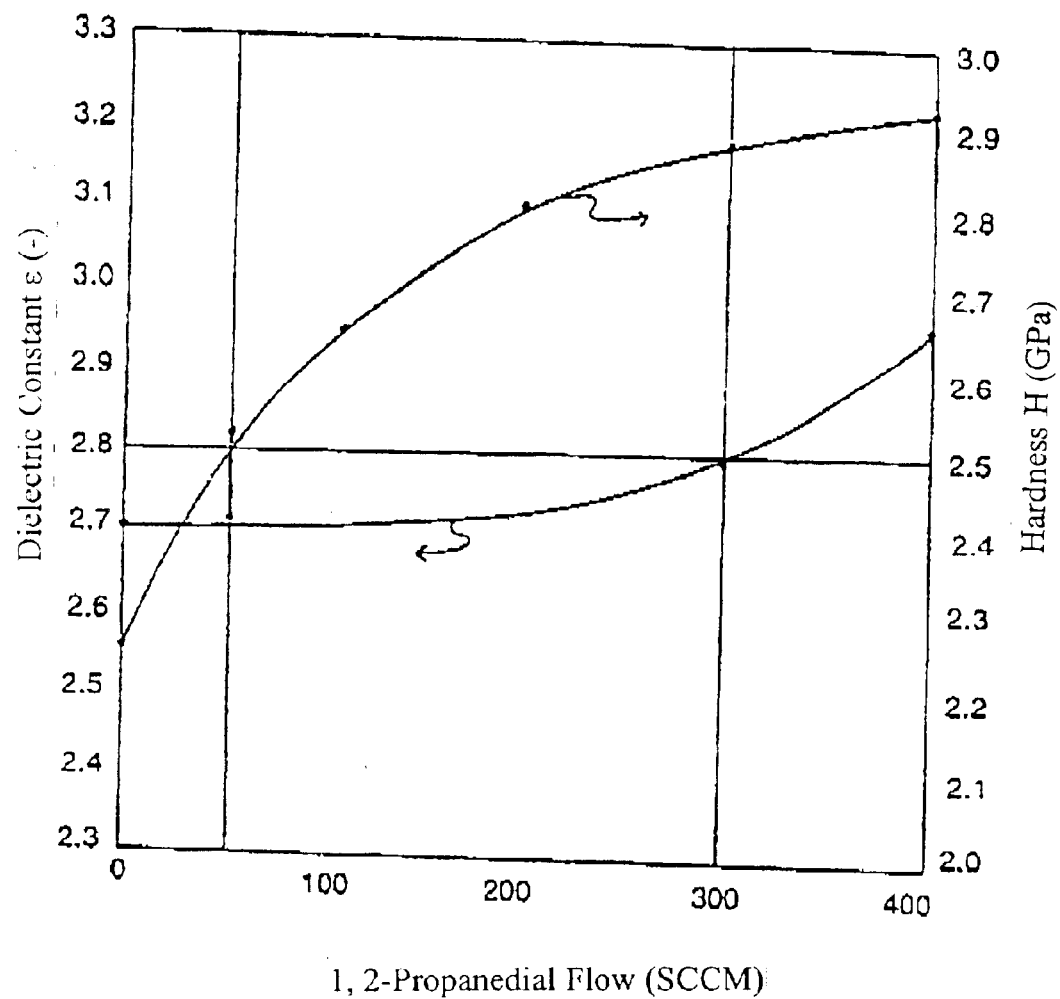
FIG. 7 is a graph showing the relationship between the dielectric constant and hardness when changing a flow rate of 1,2-propanediol in an embodiment of the present invention.

FIG. 7 is a graph showing the relationship between the dielectric constants and film hardness when a flow of 1,2-propanediol is altered from 0 to 400 sccm under the above-mentioned experimental conditions. The graph demonstrates that under the above-mentioned experimental conditions, an optimized flow of 1,2-propanediol for forming an insulation film having a dielectric constant of 2.8 or lower and film hardness of 2.5 GPa or more is 50 to 300 sccm.

Example 7

Using the plasma CVD device shown in FIG. 1, an example of forming an insulation film on a ⌀300 mm silicon substrate was performed.
Experimental Conditions:

| | | |
|---|---|---|
| Primary gas: | DM-DMOS (dimethyl-dimethoxysilane) | 150 sccm |
| Secondary gas: | 1,2 propanediol | 0 to 400 sccm |
| Addition gas: | He | 300 sccm |
| 1st radio-frequency power source: | 27.12 MHz | 2.2 W/cm2 |
| 2nd radio-frequency power source: | 400 kHz | 0 W/cm2 |

Figure 8:
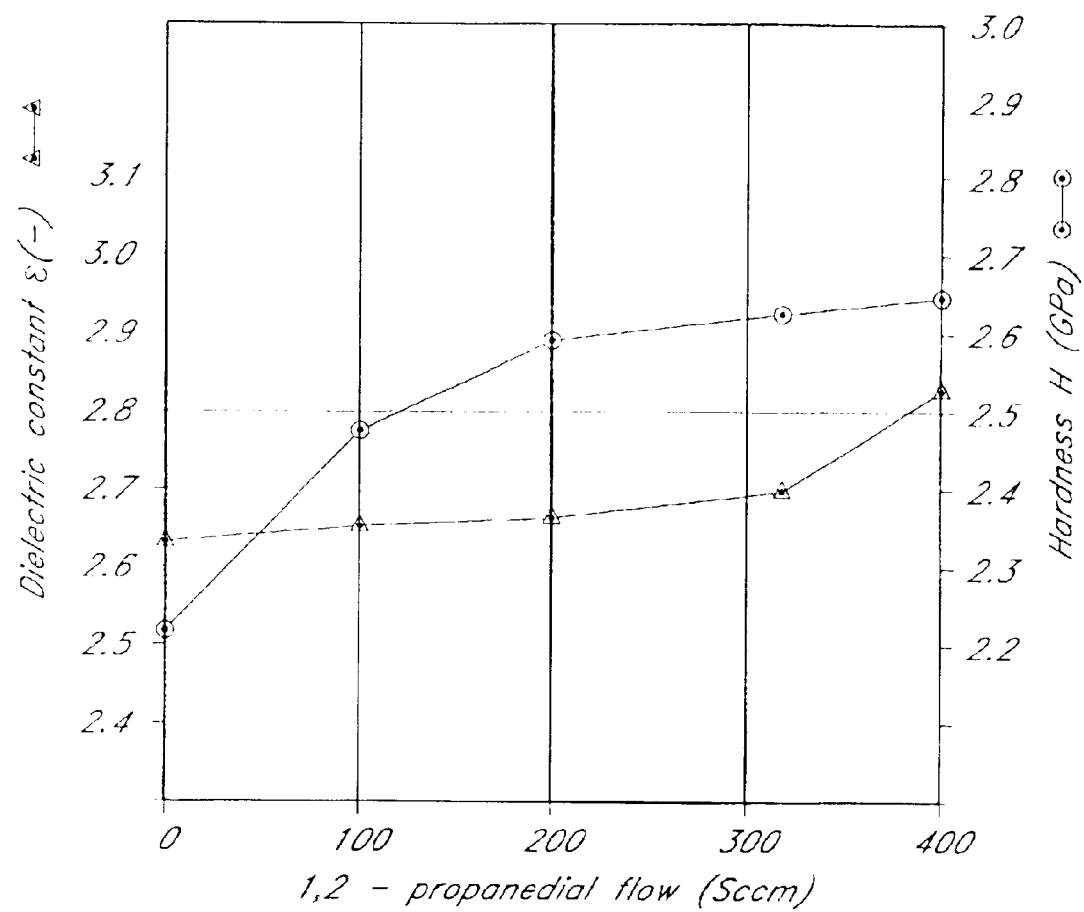
FIG. 8 is a graph showing the relationship between the dielectric constant and hardness when changing a flow rate of 1,2-propanediol in an embodiment without LF power of the present invention.

FIG. 8 is a graph showing the relationship between the dielectric constants and film hardness when a flow of 1,2-propanediol is altered from 0 to 400 sccm under the above-mentioned experimental conditions. The graph demonstrates that under the above-mentioned experimental conditions, an optimized flow of 1,2-propanediol for forming an insulation film having a dielectric constant of 2.8 or lower and film hardness of 2.5 GPa or more is 200 to 300 sccm.

Example 8

Using the plasma CVD device shown in FIG. 1, an example of forming an insulation film on a ⌀300 mm silicon substrate was performed.
Experimental Conditions:

| | | |
|---|---|---|
| Primary gas: | DM-DMOS (dimethyl-dimethoxysilane) | 200 sccm |
| Secondary gas: | $CH_2=CH_2$ (ethylene) | 0 to 500 sccm |
| Addition gas: | He | 400 sccm |
| 1st radio-frequency power source: | 27.12 MHz | 2.0 W/cm2 |
| 2nd radio-frequency power source: | 400 kHz | 0.05 W/cm2 |

Figure 9:
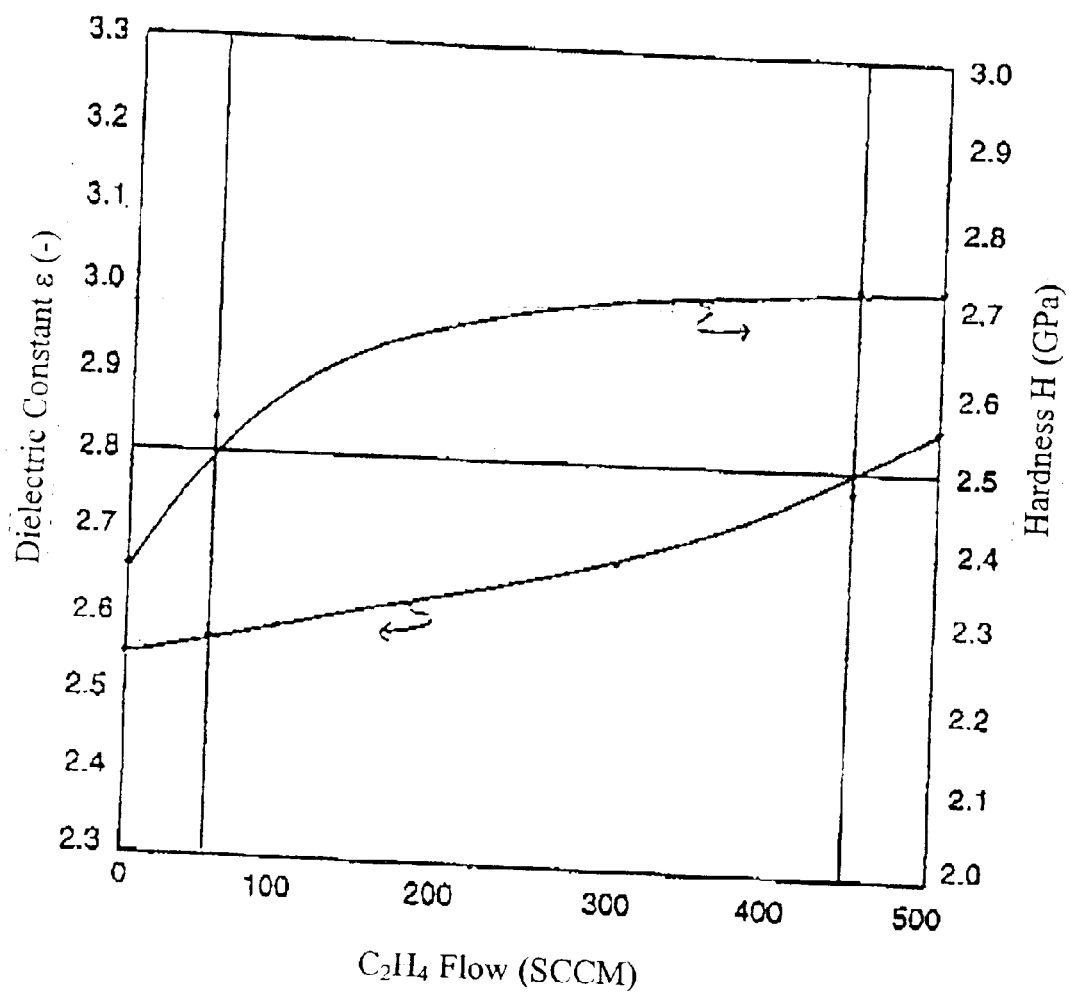
FIG. 9 is a graph showing the relationship between the dielectric constant and hardness when changing a flow rate of ethylene in an embodiment of the present invention.

FIG. 9 is a graph showing the relationship between the dielectric constants and film hardness when a flow of ethylene is altered from 0 to 500 sccm under the above-mentioned experimental conditions. The graph demonstrates that under the above-mentioned experimental conditions, an optimized flow of ethylene for forming an insulation film having a dielectric constant of 2.8 or lower and film hardness of 2.5 GPa or more is 50 to 450 sccm.

Example 9

Using the plasma CVD device shown in FIG. 1, an example of forming an insulation film on a ⌀300 mm silicon substrate was performed.
Experimental Conditions:

| | | |
|---|---|---|
| Primary gas: | DM-DMOS (dimethyl-dimethoxysilane) | 200 sccm |
| Secondary gas: | $CH_2=CH_2$ (ethylene) | 0 to 500 sccm |
| Addition gas: | He | 400 sccm |
| 1st radio-frequency power source: | 27.12 MHz | 2.0 W/cm2 |
| 2nd radio-frequency power source: | 400 kHz | 0 W/cm2 |

Figure 10:
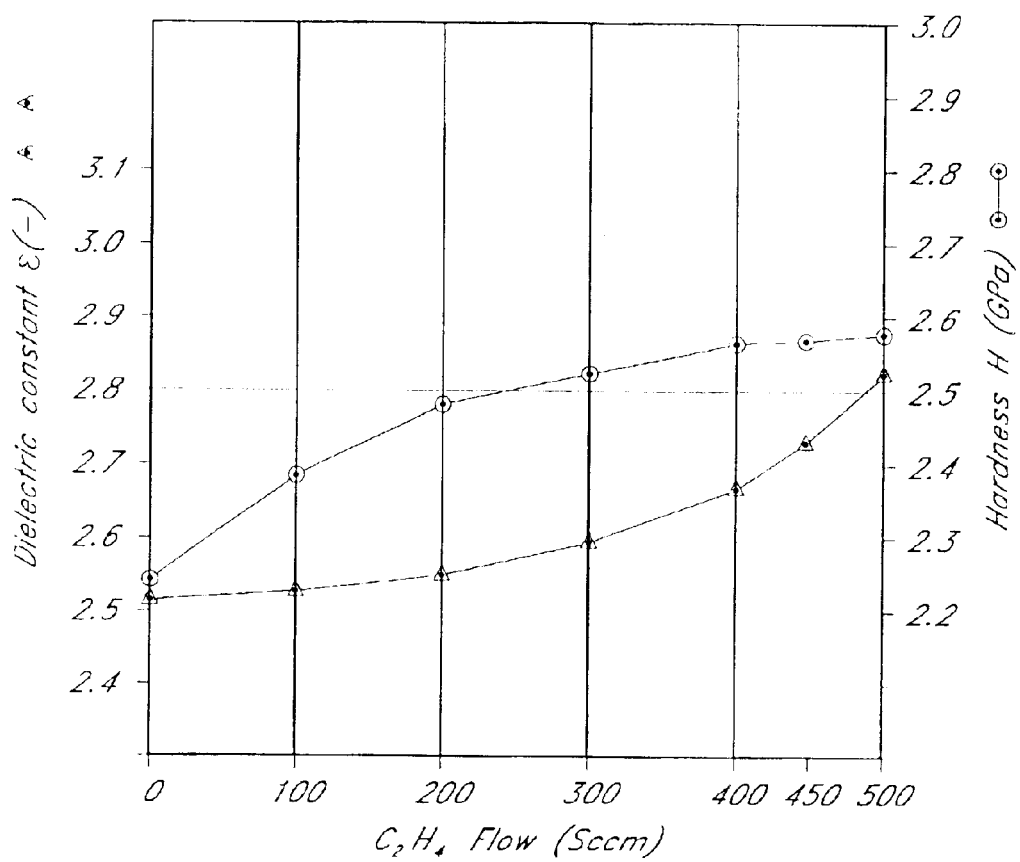
FIG. 10 is a graph showing the relationship between the dielectric constant and hardness when changing a flow rate of ethylene in an embodiment without LF power of the present invention.

FIG. 10 is a graph showing the relationship between the dielectric constants and film hardness when a flow of ethylene is altered from 0 to 500 sccm under the above-mentioned experimental conditions. The graph demonstrates that under the above-mentioned experimental conditions, an optimized flow of ethylene for forming an insulation film having a dielectric constant of 2.8 or lower and film hardness of 2.5 GPa or more is 300 to 450 sccm.

Example 10

Using the plasma CVD device shown in FIG. 1, an example of forming an insulation film on a ⌀300 mm silicon substrate was performed.
Experimental Conditions:

| | | |
|---|---|---|
| Primary gas: | DM-DMOS (dimethyl-dimethoxysilane) | 200 sccm |
| Secondary gas: | $O_2$ | 100 sccm |
| | $N_2$ | 0 to 500 sccm |
| Addition gas: | He | 400 sccm |
| 1st radio-frequency power source: | 27.12 MHz | 1.6 W/cm2 |
| 2nd radio-frequency power source: | 400 kHz | 0.1 W/cm2 |

Figure 11:
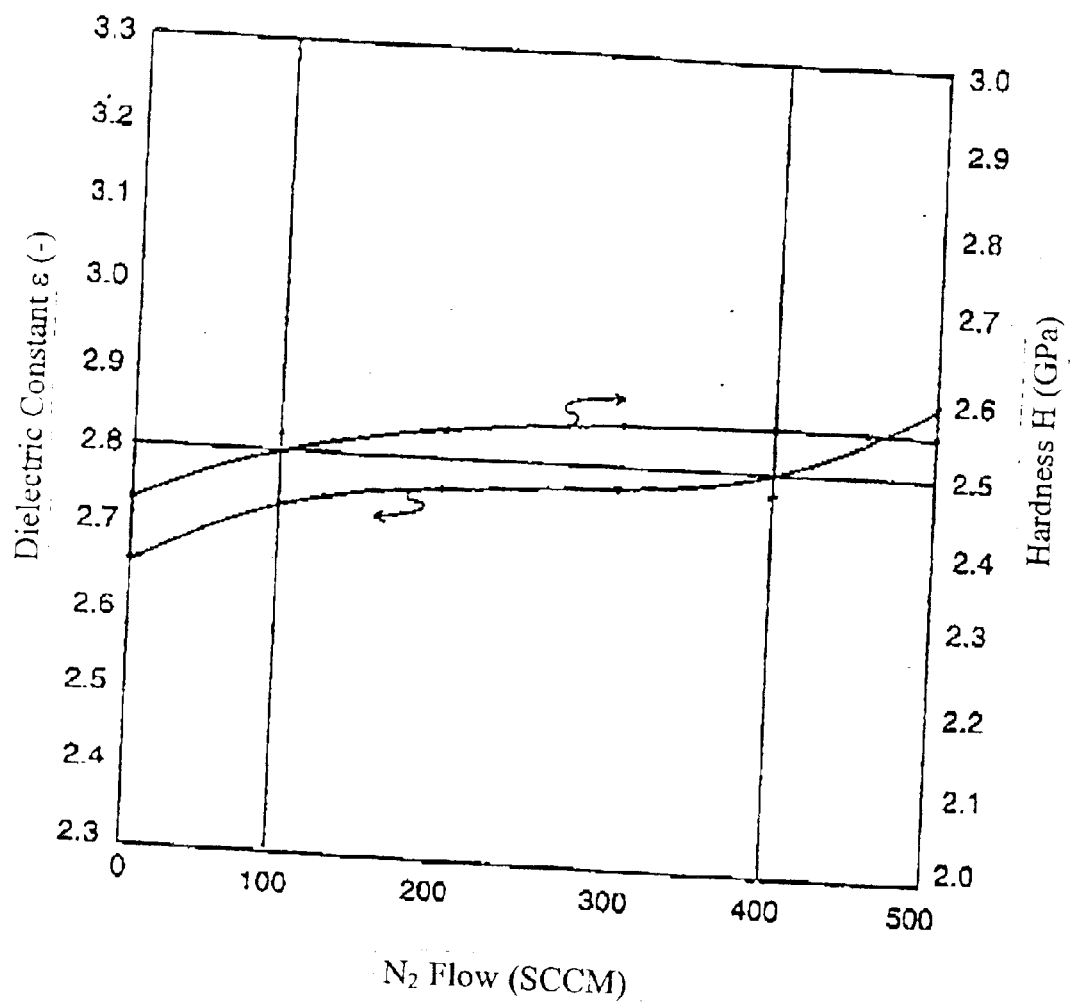
FIG. 11 is a graph showing the relationship between the dielectric constant and hardness when changing a flow rate of $N_2$ in an embodiment of the present invention.

FIG. 11 is a graph showing the relationship between the dielectric constants and film hardness when a flow of $N_2$ is altered from 0 to 500 sccm under the above-mentioned experimental conditions. The graph demonstrates that under the above-mentioned experimental conditions, an optimized flow of $N_2$ for forming an insulation film having a dielectric constant of 2.8 or lower and film hardness of 2.5 GPa or more is 100 to 400 sccm.

Example 11

Using the plasma CVD device shown in FIG. 1, an example of forming an insulation film on a ⌀300 mm silicon substrate was performed.

Experimental Conditions:

| | | |
|---|---|---|
| Primary gas: | DM-DMOS (dimethyl-dimethoxysilane) | 200 sccm |
| Secondary gas: | O₂ | 100 sccm |
| | N₂ | 0 to 500 sccm |
| Addition gas: | He | 400 sccm |
| 1st radio-frequency power source: | 27.12 MHz | 1.6 W/cm2 |
| 2nd radio-frequency power source: | 400 kHz | 0 W/cm2 |

Figure 12:
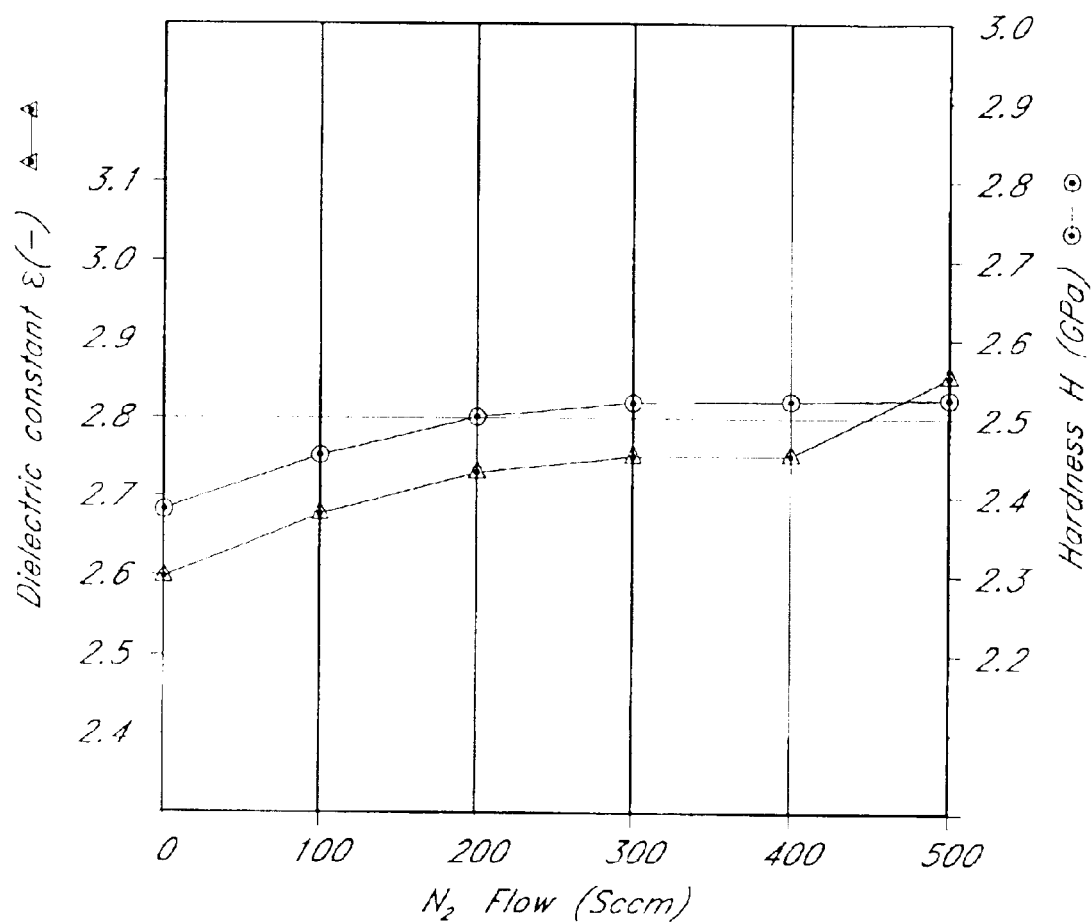
FIG. 12 is a graph showing the relationship between the dielectric constant and hardness when changing a flow rate of $N_2$ in an embodiment without LF power of the present invention.

FIG. 12 is a graph showing the relationship between the dielectric constants a film hardness when a flow of $N_2$ is altered from 0 to 500 sccm under the above-mentioned experimental conditions. The graph demonstrates that under the above-mentioned experimental conditions, an optimized flow of $N_2$ for forming an insulation film having a dielectric constant of 2.8 or lower and film hardness of 2.5 GPa or more is 200 to 400 sccm.

Example 12

Using the plasma CVD device shown in FIG. 1, an example of forming an insulation film on a ⌀300 mm silicon substrate was performed.

Experimental Conditions:

| | | |
|---|---|---|
| Primary gas: | DMOTMDS(1,3-dimethoxytetra-methyldisiloxane) | 200 sccm |
| Secondary gas: | O₂ | 100 sccm |
| | Isopropyl alcohol (IPA) | 0 to 500 sccm |
| Addition gas: | He | 200 sccm |
| 1st radio-frequency power source: | 27.12 MHz | 2.5 W/cm2 |
| 2nd radio-frequency power source: | 400 kHz | 0.05 W/cm2 |

Figure 13:
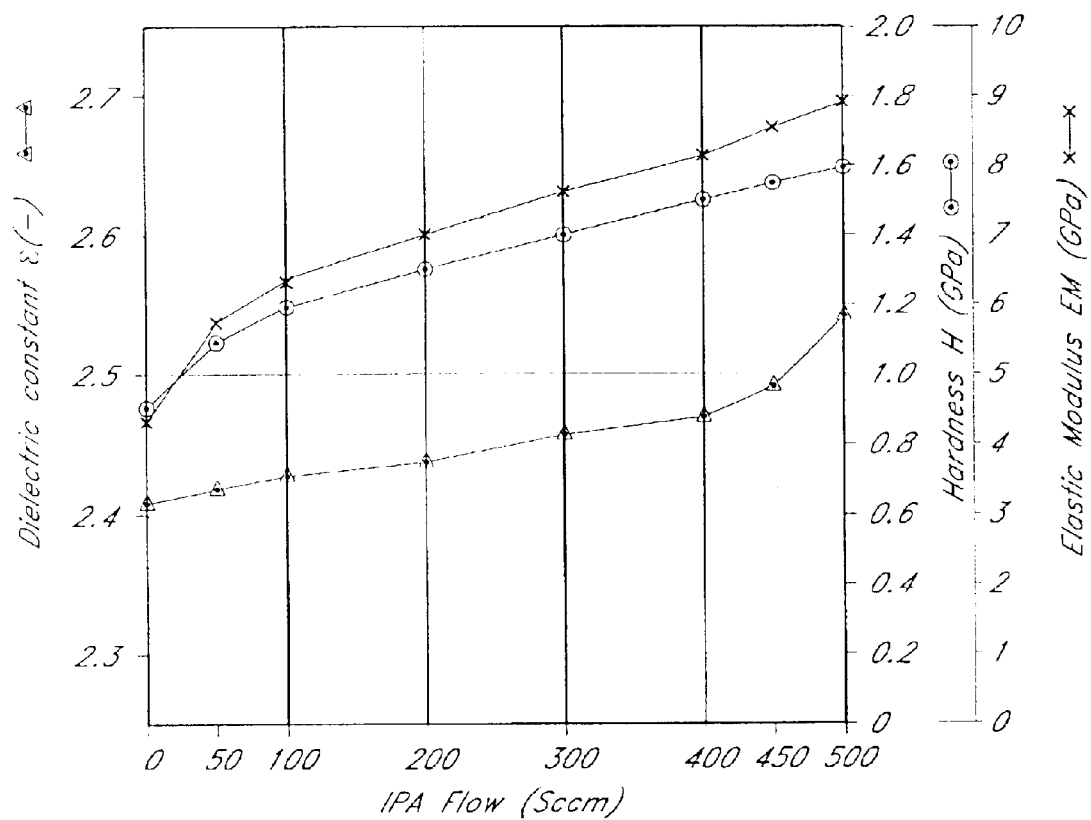
FIG. 13 is a graph showing the relationship between the dielectric constant and hardness/elastic modulus when changing a flow rate of isopropyl alcohol in an embodiment of the present invention.

Table 1 and FIG. 13 show the relationship between the dielectric constants and film hardness/elastic modulus when a flow of isopropyl alcohol is altered from 0 to 500 sccm under the above-mentioned experimental conditions. The graph demonstrates that under the above-mentioned experimental conditions, an optimized flow of isopropyl alcohol for forming an insulation film having a dielectric constant of 2.5 or lower and film hardness of 1.0 GPa or as well as elastic modulus of 5.0 GPa or higher is 50 to 450 sccm.

TABLE 1

| Flow (Sccm) | Dielectric constant ε | Hardness H (GPa) | Elastic Modulus EM (GPa) |
|---|---|---|---|
| 0 | 2.41 | 0.90 | 4.2 |
| 50 | 2.42 | 1.10 | 5.8 |
| 100 | 2.43 | 1.20 | 6.3 |
| 200 | 2.44 | 1.30 | 7.0 |
| 300 | 2.46 | 1.40 | 7.6 |
| 400 | 2.47 | 1.50 | 8.2 |
| 450 | 2.49 | 1.54 | 8.5 |
| 500 | 2.54 | 1.58 | 8.8 |

Example 13

Using the plasma CVD device shown in FIG. 1, an example of forming an insulation film on a ⌀300 mm silicon substrate was performed.

Experimental Conditions:

| | | |
|---|---|---|
| Primary gas: | DMOTMDS(1,3-dimethoxytetra-methyldisiloxane) | 200 sccm |
| Secondary gas: | O₂ | 100 sccm |
| | Isopropyl alcohol (IPA) | 0 to 500 sccm |
| Addition gas: | He | 200 sccm |
| 1st radio-frequency power source: | 27.12 MHz | 2.5 W/cm2 |
| 2nd radio-frequency power source: | 400 kHz | 0 W/cm2 |

Figure 14:
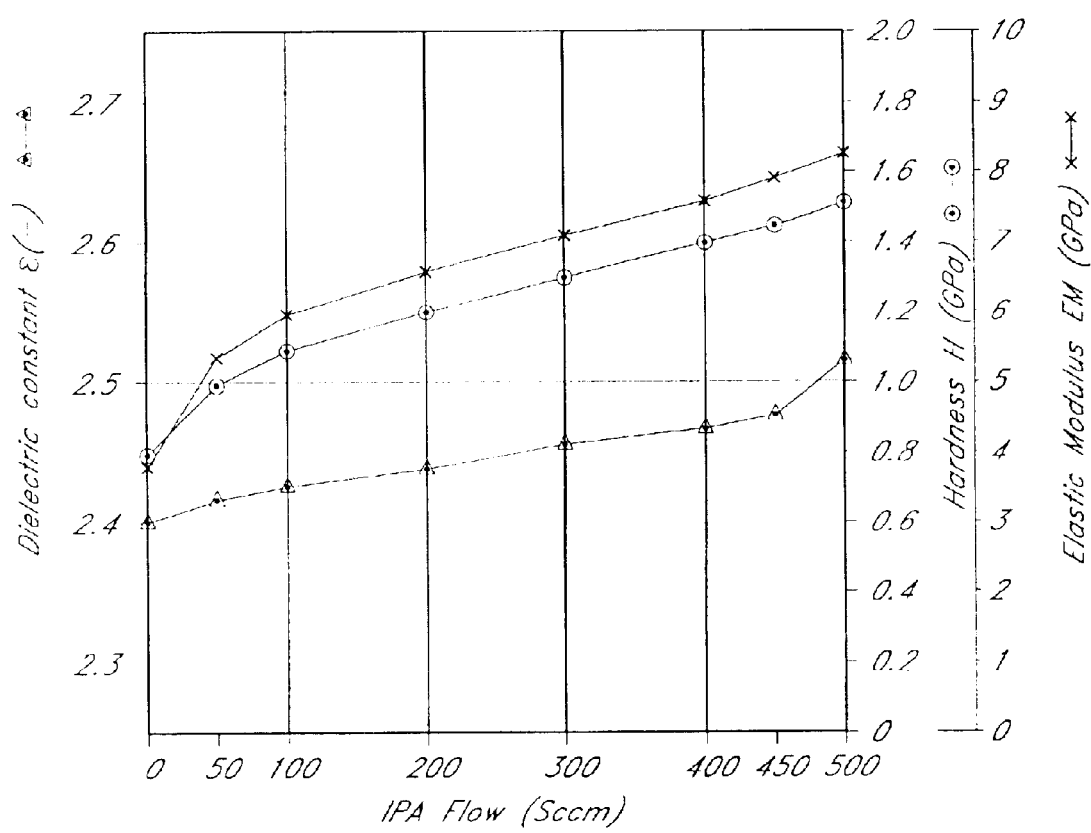
FIG. 14 is a graph showing the relationship between the dielectric constant and hardness/elastic modulus when changing a flow rate of isopropyl alcohol in an embodiment without LF power of the present invention.

Table 2 and FIG. 14 show the relationship between the dielectric constants and film hardness/elastic modulus when a flow of isopropyl alcohol is altered from 0 to 500 sccm under the above-mentioned experimental conditions. The graph demonstrates that under the above mentioned experimental conditions, an optimized flow of isopropyl alcohol for forming an insulation film having a dielectric constant of 2.5 or lower and film hardness of 1.0 GPa or higher as well as elastic modulus of 5.0 GPa or higher is 50 to 450 sccm.

TABLE 2

| Flow (Sccm) | Dielectric constant ε | Hardness H (GPa) | Elastic Modulus EM (GPa) |
|---|---|---|---|
| 0 | 2.40 | 0.80 | 3.8 |
| 50 | 2.42 | 1.00 | 5.3 |
| 100 | 2.43 | 1.10 | 5.8 |
| 200 | 2.44 | 1.20 | 6.6 |
| 300 | 2.46 | 1.30 | 7.2 |
| 400 | 2.47 | 1.40 | 7.7 |
| 450 | 2.48 | 1.46 | 7.9 |
| 500 | 2.52 | 1.50 | 8.2 |

Example 14

Using the plasma CVD device shown in FIG. 1, an example of forming an insulation film on a ⌀300 mm silicon substrate was performed.

Experimental Conditions:

| | | |
|---|---|---|
| Primary gas | DMOTMDS(1,3-dimethoxytetra-methyldisiloxane) | 200 sccm |
| Secondary gas: | O₂ | 150 sccm |
| | diethyl ether | 0 to 500 sccm |
| Addition gas: | He | 250 sccm |
| 1st radio-frequency power source: | 27.12 MHz | 2.3 W/cm2 |
| 2nd radio-frequency power source: | 400 kHz | 0.075 W/cm2 |

Figure 15:
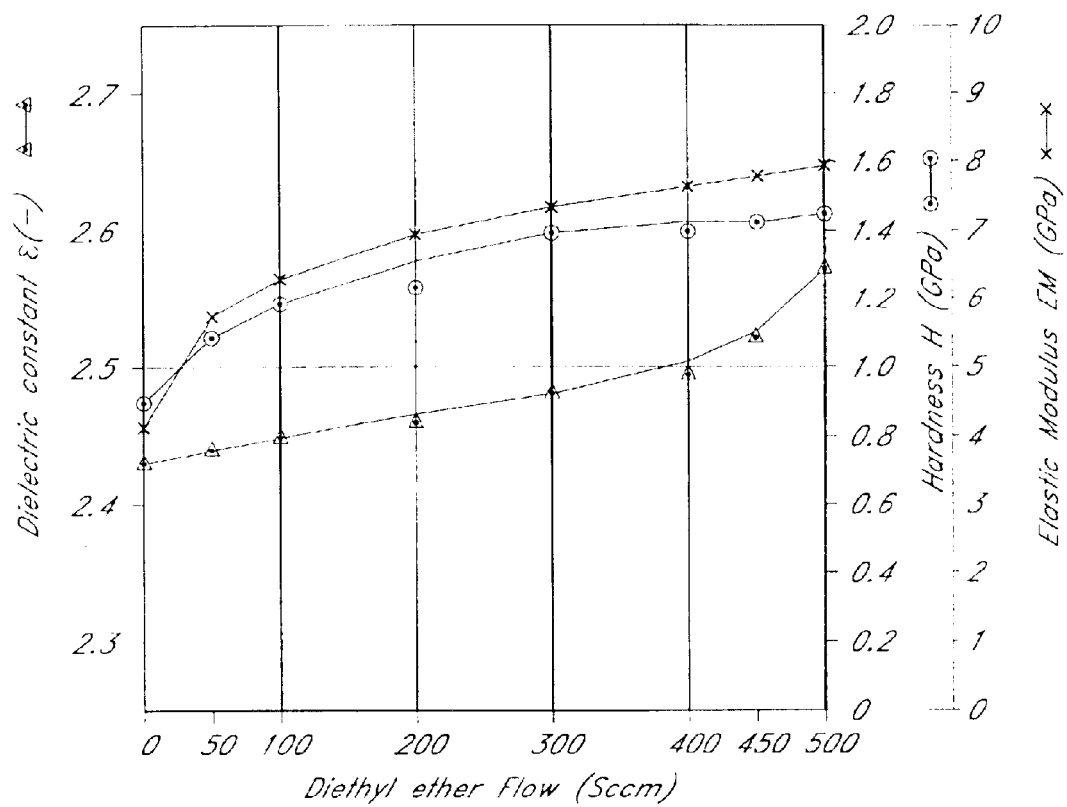
FIG. 15 is a graph showing the relationship between the dielectric constant and hardness/elastic modulus when changing a flow rate of diethyl ether in an embodiment of the present invention.

Table 3 and FIG. 15 show the relationship between the dielectric constants and film hardness/elastic modulus when a flow of diethyl ether is altered from 0 to 500 sccm under the above-mentioned experimental conditions. The graph demonstrates that under the above-mentioned experimental conditions, an optimized flow of diethyl ether for forming an insulation film having a dielectric constant of 2.5 or lower and film hardness of 1.0 GPa or higher as well as elastic modulus of 5.0 GPa or higher is 50 to 400 sccm.

TABLE 3

| Flow (Sccm) | Dielectric constant ϵ | Hardness H (GPa) | Elastic Modulus EM (GPa) |
|---|---|---|---|
| 0 | 2.43 | 0.85 | 4.0 |
| 50 | 2.44 | 1.08 | 5.8 |
| 100 | 2.45 | 1.17 | 6.3 |
| 200 | 2.46 | 1.22 | 7.1 |
| 300 | 2.48 | 1.36 | 7.6 |
| 400 | 2.49 | 1.39 | 7.8 |
| 450 | 2.52 | 1.40 | 7.9 |
| 500 | 2.57 | 1.44 | 8.0 |

Example 15

Using the plasma CVD device shown in FIG. 1, an example of forming an insulation film on a Ø300 mm silicon substrate was performed.
Experimental Conditions:

| Primary gas: | DMOTMDS(1,3-dimethoxytetra-methyldisiloxane) | 200 sccm |
|---|---|---|
| Secondary gas: | $O_2$ | 150 sccm |
| | diethyl ether | 0 to 500 sccm |
| Addition gas: | He | 250 sccm |
| 1st radio-frequency power source: | 27.12 MHz | 2.3 W/cm2 |
| 2nd radio-frequency power source: | 400 kHz | 0 W/cm2 |

Figure 16:
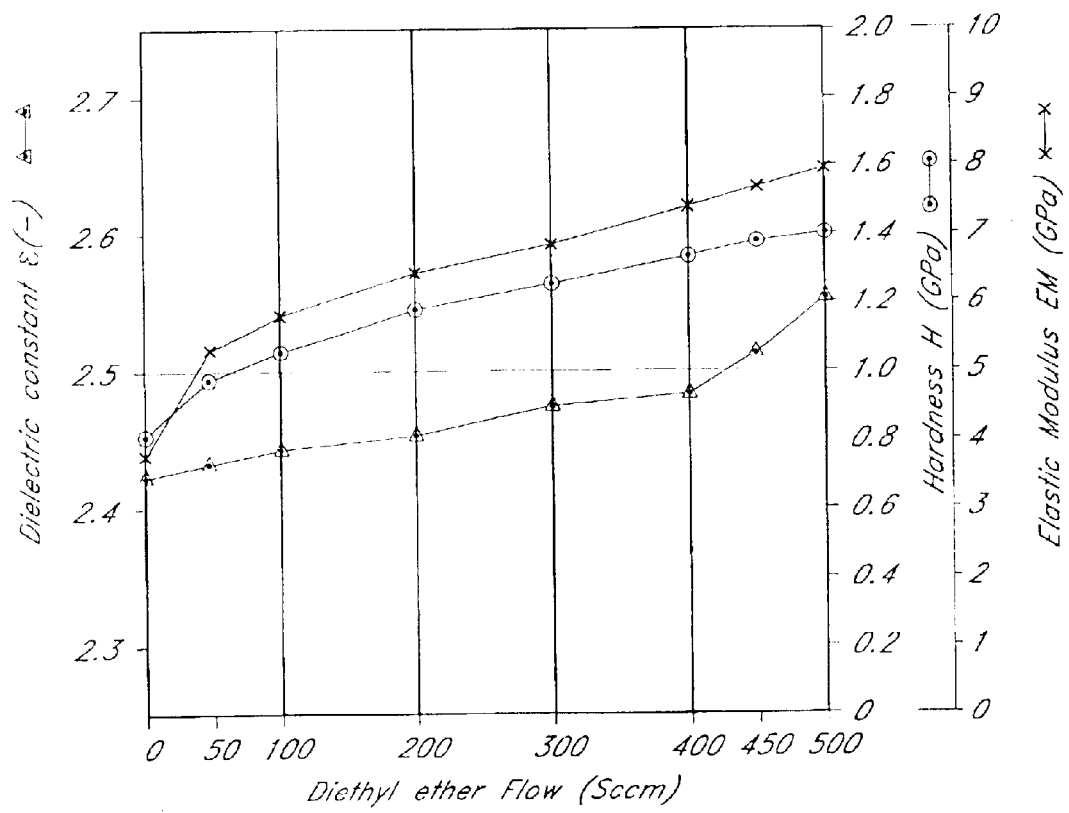
FIG. 16 is a graph showing the relationship between the dielectric constant and hardness/elastic modulus when changing a flow rate of diethyl ether in an embodiment without LF power of the present invention.

Table 4 and FIG. 16 show the relationship between the dielectric constants and film hardness/elastic modulus when a flow of diethyl ether is altered from 0 to 500 sccm under the above-mentioned experimental conditions. The graph demonstrates that under the above-mentioned experimental conditions, an optimized flow of diethyl ether for forming an insulation film having a dielectric constant of 2.5 or lower and film hardness of 1.0 GPa or higher as well as elastic modulus of 5.0 GPa or higher is 100 to 400 sccm.

TABLE 4

| Flow (Sccm) | Dielectric constant ϵ | Hardness H (GPa) | Elastic Modulus EM (GPa) |
|---|---|---|---|
| 0 | 2.42 | 0.80 | 3.7 |
| 50 | 2.43 | 0.96 | 4.9 |
| 100 | 2.44 | 1.04 | 5.6 |
| 200 | 2.45 | 1.16 | 6.3 |
| 300 | 2.47 | 1.24 | 7.1 |
| 400 | 2.48 | 1.31 | 7.5 |
| 450 | 2.51 | 1.35 | 7.6 |
| 500 | 2.55 | 1.38 | 7.8 |

As shown above, using the method of forming an insulation film having a low-dielectric constant according to an embodiment of the present invention, an insulation film having a low dielectric constant and high hardness can be formed by optimizing a flow of gasses and the power density of the radio-frequency power sources. Additionally, using the method of forming an insulation film having a low-dielectric constant according to an embodiment of the present invention, an insulation film having a low-dielectric constant can be formed easily without increasing device costs.

Although this invention has been described in terms of certain examples, other examples apparent to those of ordinary skill in the art are within the scope of this invention. Accordingly, the scope of the invention is intended to be defined only by the claims that follow. The present invention includes various embodiments and are not limited to the above examples. The present invention particularly includes, but are not limited to, the following embodiments, and any combination of the forgoing embodiments and the following embodiments can readily be accomplished:

1) A method of forming an insulation film having a low-dielectric constant by a plasma CVD method, which comprises a process of bringing a reaction gas comprising a silicon-containing hydrocarbon having multiple alkoxy groups, $CO_2$, and Ar and/or He into a reaction chamber, a process of applying radio-frequency power by overlaying first radio-frequency power and second radio-frequency power or a process of applying the first radio-frequency power alone for generating a plasma reaction field inside said reaction chamber, and a process of optimizing a flow of said respective gases and output of said each radio-frequency power.

2) The method as described in Item 1, wherein said silicon-containing hydrocarbon having multiple alkoxy groups is DM-DMOS (dimethyl-dimethoxysilane).

3) The method as described in item 1, wherein said silicon-containing hydrocarbon having multiple alkoxy groups is 1,3-dimethxytetramethyldisiloxame (DMOTMDS).

4) The method as described in any one of items 1 to 3, wherein $O_2$ or $N_2O$ is further included in the reaction gas.

5) A method of forming an insulation film having a low-dielectric constant by a plasma CVD method, which comprises a process of bringing a reaction gas comprising a silicon-containing hydrocarbon having multiple alkoxy groups, alcohol, and Ar and/or He into a reaction chamber, a process of applying radio-frequency power by overlaying first radio-frequency power and second radio-frequency power or a process of applying the first radio-frequency power alone for generating a plasma reaction field inside said reaction chamber, and a process of optimizing a flow of said respective gases and output of said each radio-frequency power.

6) The method as described in item 5, wherein said silicon-containing hydrocarbon having multiple alkoxy groups is DM-DMOS (dimethyl-dimethoxysilane).

7) The method as described in item 5, wherein said silicon-containing hydrocarbon having multiple alkoxy groups is 1,3-dimethxytetramethyldisiloxame (DMOTMDS).

8) The method as described in item 5, wherein said alcohol is ethylene glycol.

9) The method as described in item 5, wherein said alcohol is 1,2 propanediol.

10) The method as described in item 5, wherein said alcohol is isopropyl alcohol (IPA).

11) The method as described in any one of items 5 to 10, wherein $O_2$ or $N_2O$ is further included as a source gas.

12) A method of forming an insulation film having a low-dielectric constant by a plasma CVD method, which comprises a process of bringing a reaction gas comprising a silicon-containing hydrocarbon having multiple alkoxy groups, a hydrocarbon which contains at least one unsaturated bond, and Ar and/or He into a reaction chamber, a process of applying radio-frequency power by overlaying first radio-frequency power and second radio-frequency power or a process of applying the first radio-frequency power alone for generating a plasma reaction field inside said reaction chamber, and a process of optimizing a flow of said respective gases and output of said each radio-frequency power.

13) The method as described in item 12, wherein said silicon-containing hydrocarbon having multiple alkoxy groups is DM-DMOS (dimethyl-dimethoxysilane).

14) The method as described in item 12, wherein said silicon-containing hydrocarbon having multiple alkoxy groups is 1,3-dimethxytetramethyldisiloxame (DMOTMDS).

15) The method as described in item 12, wherein said hydrocarbon containing at least one unsaturated bond is ethylene.

16) The method as described in any one of items 12 to 15, wherein $O_2$ or $N_2O$ is further included as a source gas.

17) A method of forming an insulation film having a low-dielectric constant by a plasma CVD method, which comprises a process of bringing a reaction gas comprising a silicon-containing hydrocarbon having multiple alkoxy groups, $N_2$, and Ar and/or He into a reaction chamber, a process of applying radio-frequency power by overlaying first radio-frequency power and second radio-frequency power or a process of applying the first radio-frequency power alone for generating a plasma reaction field inside said reaction chamber, and a process of optimizing a flow of said respective gases and output of said each radio-frequency power.

18) The method as described in item 17, wherein said silicon-containing hydrocarbon having multiple alkoxy groups is DM-DMOS (dimethyl-dimethoxysilane).

19) The method as described in item 17, wherein said silicon-containing hydrocarbon having multiple alkoxy groups is 1,3-dimethxytetramethyldisiloxame (DMOTMDS).

20) The method as described in any one of items 17 to 19, wherein $O_{O2}$ or $N_2O$ is further included as a source gas.

21) A method of forming an insulation film having a low-dielectric constant by a plasma CVD method, which comprises a process of bringing a reaction gas comprising a silicon-containing hydrocarbon having multiple alkoxy groups, ether, and Ar and/or He into a reaction chamber, a process of applying radio-frequency power by overlaying first radio-frequency power and second radio-frequency power or a process of applying the first radio-frequency power alone for generating a plasma reaction field inside said reaction chamber, and a process of optimizing a flow of said respective gases and output of said each radio-frequency power.

22) The method as described in item 21, wherein said silicon-containing hydrocarbon having multiple alkoxy groups is DM-DMOS (dimethyl-dimethoxysilane).

23) The method as described in item 21, wherein said silicon-containing hydrocarbon having multiple alkoxy groups is 1,3-dimethxytetramethyldisiloxame (DMOTMDS).

24) The method as described in item 21, wherein said ether is diethyl ether.

25) The method as described in any one of items 21 to 24, wherein $O_2$ or $N_2O$ is further included as a source gas.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming a silicon-containing insulation film on a substrate by plasma reaction, comprising the steps of:

introducing a reaction gas comprising (i) a source gas comprising a silicon-containing hydrocarbon compound containing multiple cross-linkable groups, (ii) a cross-linking gas, and (iii) an inert gas, into a reaction chamber where a substrate is placed;

applying radio-frequency power to create a plasma reaction space inside the reaction chamber; and controlling a flow of the reaction gas and an intensity of the radio-frequency power.

2. The method according to claim 1, wherein the cross-linkable groups of the silicon-containing hydrocarbon compound are alkoxy groups and/or vinyl groups.

3. The method according to claim 1, wherein the cross-linking gas is selected from the group consisting of alcohol, ether, unsaturated hydrocarbon, $CO_2$, and $N_2$.

4. The method according to claim 3, wherein the alcohol is selected from the group consisting of $C_{1-6}$ alkanol and $C_{4-12}$ cycloalkanol.

5. The method according to claim 3, wherein the unsaturated hydrocarbon is selected from the group consisting of $C_{1-6}$ unsaturated hydrocarbon, $C_{4-12}$ aromatic hydrocarbon unsaturated compounds, and $C_{4-12}$ alicyclic hydrocarbon unsaturated compounds.

6. The method according to claim 3, wherein the ether is selected from the group consisting of $C_{3-20}$ ether and $C_{5-12}$ cycloalkanol vinyl compounds.

7. The method according to claim 2, wherein the source gas is a compound having the formula $Si_\alpha O_{\alpha-1} R_{2\alpha-\beta+2}(OC_n H_{2n+1})_\beta$ wherein $\alpha$ is an integer of 1–3, $\beta$ is 2 or 3, n is an integer of 1–3, and R is attached to Si and selected from the group consisting of $C_{1-12}$ hydrocarbon, $C_{1-12}$ fluorohydrocarbon, $C_{1-12}$ perfluorocarbon, H, D, F, Cl, Br, and I.

8. The method according to claim 7, wherein $\alpha$ is 1 or 2, and $\beta$ is 2.

9. The method according to claim 7, wherein R is $C_{1-6}$ hydrocarbon.

10. The method according to claim 9, where is the source gas is dimethyldimethoxysilane.

11. The method according to claim 7, wherein the source gas is 1,3-dimethoxytetramethyldisiloxane.

12. The method according to claim 2, wherein the source gas is 1,3-divinyltetramethyldisiloxan.

13. The method according to claim 1, wherein the radio-frequency power is a combination of high-frequency power and low-frequency power.

14. The method according to claim 13, wherein the high-frequency power has a frequency of 2 MHz or higher, and the lower-frequency power has a frequency of less than 2 MHz.

15. The method according to claim 1, wherein the radio-frequency power is a single frequency power.

16. The method according to claim 1, wherein the flow of the reaction gas and the intensity of the power are controlled to form an insulation film having a hardness of 1.0 GPa or higher.

17. The method according to claim 1, wherein the flow of the reaction gas and the intensity of the power are controlled to form an insulation film having a hardness of 2.5 GPa or higher.

18. The method according to claim 1, wherein the inert gas is selected from the group consisting of Ar, Ne, and He.

19. The method according to claim 1, wherein the reaction gas further comprises an oxygen-supplying gas.

20. The method according to claim 19, wherein the oxygen-supplying gas is selected from the group consisting of $O_2$ and $N_2O$.

21. The method according to claim 19, wherein the oxygen-supplying gas is supplied at a flow rate lower than that of the source gas.

22. The method according to claim 1, wherein the intensity of the radio-frequency power is 1.5 W/cm² or higher.

23. The method according to claim 13, wherein the intensity of the high-frequency power is 1.5 W/cm² or higher, and the intensity of the low-frequency power is 0.01 W/cm² or higher.

24. The method according to claim 1, wherein the inert gas is supplied at a flow rate of 15–300% of that of the source gas.

25. The method according to claim 1, wherein the cross-linking gas is a $C_{2-4}$ alkanol.

26. The method according to claim 25, wherein $C_{2-4}$ alkanol is ethylene glycol, 1,2 propanediol, or isopropyl alcohol.

27. The method according to claim 1, wherein the cross-linking gas is a $C_{2-4}$ ether.

28. The method according to claim 27, wherein the $C_{2-4}$ ether is diethyl ether.

29. The method according to claim 1, wherein the cross-linking gas is a $C_{2-4}$ unsaturated hydrocarbon.

30. The method according to claim 29, wherein the $C_{2-4}$ unsaturated hydrocarbon is ethylene.

31. The method according to claim 1, wherein the cross-linking gas is supplied at a flow rate effective to cross link oligomers of compounds of the source gas, thereby increasing hardness of an insulation film formed on the substrate.

32. The method according to claim 31, wherein the flow rate of the cross-linking gas is 20–500% of that of the source gas.

33. The method according to claim 1, wherein the reaction gas is excited upstream of the reaction chamber.

34. A method for forming a silicon-containing insulation film on a substrate by plasma reaction, comprising the steps of:

introducing a reaction gas comprising (i) a source gas comprising a silicon-containing hydrocarbon compound containing plural alkoxy groups, (ii) a cross-linking gas selected from the group consisting of $C_{1-6}$ alkanol, $C_{1-6}$ ether, $C_{1-6}$ unsaturated hydrocarbon, $CO_2$, and $N_2$, and (iii) an inert gas, into a reaction chamber where a substrate is placed;

applying radio-frequency power to create a plasma reaction space inside the reaction chamber; and controlling a flow of the reaction gas and an intensity of the radio-frequency power.

35. A method for increasing mechanical strength of a silicon-containing insulation film formed on a substrate, comprising the steps of:

mixing a cross-linking gas selected into a source gas comprising a silicon-containing hydrocarbon compound containing cross-linkable groups, with an inert gas;

introducing the mixture gas as a reaction gas into a reaction chamber where a substrate is placed;

applying radio-frequency power to create a plasma reaction space inside the reaction chamber; and controlling a flow of the reaction gas and an intensity of the radio-frequency power.

36. The method according to claim 35, wherein the radio-frequency power is a combination of high-frequency power and low-frequency power.

37. The method according to claim 35, wherein the high-frequency power has a frequency of 2 MHz or higher, and the lower-frequency power has a frequency of less than 2 MHz.

38. The method according to claim 35, wherein the cross-linking gas is supplied at a flow rate effective to cross link oligomers of compounds of the source gas, thereby obtaining a hardness of 1.0 GPa or higher, an elastic modulus of 5.0 GPa or higher, and a dielectric constant of 2.5 or lower.

39. The method according to claim 35, wherein the cross-linking gas is supplied at a flow rate effective to cross link oligomers of compounds of the source gas, thereby obtaining a hardness of 2.5 GPa or higher and a dielectric constant of 2.8 or lower.

40. The method according to claim 35, wherein the reaction gas is excited upstream of the reaction chamber.

41. The method according to claim 35, wherein the cross-linkable groups of the silicon-containing hydrocarbon compound are alkoxy groups and/or vinyl groups.

42. The method according to claim 35, wherein the cross-linking gas is selected from the group consisting of alcohol, ether, unsaturated hydrocarbon, $CO_2$, and $N_2$.

43. The method according to claim 42, wherein the alcohol is selected from the group consisting of $C_{1-6}$ alkanol and $C_{4-12}$ cycloalkanol.

44. The method according to claim 42, wherein the unsaturated hydrocarbon is selected from the group consisting of $C_{1-6}$ unsaturated hydrocarbon, $C_{4-12}$ aromatic hydrocarbon unsaturated compounds, and $C_{4-12}$ alicyclic hydrocarbon unsaturated compounds.

45. The method according to claim 42, wherein the ether is selected from the group consisting of $C_{3-20}$ ether and $C_{5-12}$ cycloalkanol vinyl compounds.

46. The method according to claim 41, wherein the source gas is a compound having the formula $Si_\alpha O_{\alpha-1} R_{2\alpha-\beta+2}(OC_n H_{2n+1})_\beta$ wherein $\alpha$ is an integer of 1–3, $\beta$ is 2 or 3, n is an integer of 1–3, and R is attached to Si and selected from the group consisting of $C_{1-12}$ hydrocarbon, $C_{1-12}$ fluorohydrocarbon, $C_{1-12}$ perfluorocarbon, H, D, F, Cl, Br, and I.

47. The method according to claim 46, where is the source gas is dimethyldimethoxysilane.

48. The method according to claim 46, wherein the source gas is 1,3-dimethoxytetramethyldisiloxane.

49. The method according to claim 41, wherein the source gas is 1,3-divinyltetramethyldisiloxan.

* * * * *